United States Patent
Lu et al.

(10) Patent No.: US 12,489,001 B2
(45) Date of Patent: Dec. 2, 2025

(54) WET ETCH APPARATUS

(71) Applicant: TAIWAN SEMICONDUCTOR MANUFACTURING CO., LTD., Hsinchu (TW)

(72) Inventors: Hong-Ting Lu, Taichung (TW); Han-Wen Liao, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/791,036

(22) Filed: Jul. 31, 2024

(65) Prior Publication Data

US 2024/0395572 A1    Nov. 28, 2024

Related U.S. Application Data

(62) Division of application No. 17/460,209, filed on Aug. 28, 2021, now Pat. No. 12,249,520, which is a
(Continued)

(51) Int. Cl.
*H01L 21/67* (2006.01)
*C25F 3/02* (2006.01)
(Continued)

(52) U.S. Cl.
CPC ............ *H01L 21/6708* (2013.01); *C25F 3/02* (2013.01); *C25F 3/12* (2013.01); *H01L 21/306* (2013.01); *H01L 21/30604* (2013.01); *H01L 21/30608* (2013.01); *H01L 21/3063* (2013.01); *H01L 21/32133* (2013.01); *H01L 21/32134* (2013.01);
(Continued)

(58) Field of Classification Search
None
See application file for complete search history.

(56) References Cited

U.S. PATENT DOCUMENTS 6,245,213 B1    6/2001   Olsson et al.
7,569,490 B2    8/2009   Staud
(Continued)

FOREIGN PATENT DOCUMENTS

CN    108231581 A    6/2018
CN    108538710 A    9/2018
TW    201040326 A    11/2010

OTHER PUBLICATIONS

H.H. Lee, "Novel Electrowetting Application for Green Smart Window", Industrial Materials Magazine No. 295, (Jul. 5, 2001).
(Continued)

*Primary Examiner* — Wojciech Haske
(74) *Attorney, Agent, or Firm* — Maschoff Brennan

(57) ABSTRACT

A wet etch apparatus includes a wafer chuck, a dispensing nozzle above the wafer chuck, a rail, first and second vehicles, and an electric field generator. The rail extends at least from a first position aligned laterally with the wafer chuck to a second position higher than a top surface of the wafer chuck. The first and second vehicles are movable along the rail. The electric field generator is operative to generate an electric field across the wafer chuck. The electric field generator comprises a first electrode carried by the first vehicle and a second electrode carried by the second vehicle.

20 Claims, 32 Drawing Sheets

Related U.S. Application Data division of application No. 16/437,775, filed on Jun. 11, 2019, now Pat. No. 11,107,707.

(60) Provisional application No. 62/771,461, filed on Nov. 26, 2018.

(51) Int. Cl.
| | |
|---|---|
| *C25F 3/12* | (2006.01) |
| *H01L 21/306* | (2006.01) |
| *H01L 21/3063* | (2006.01) |
| *H01L 21/3213* | (2006.01) |
| *H01L 21/683* | (2006.01) |
| *H01L 21/687* | (2006.01) |
| *H10D 64/01* | (2025.01) |

(52) U.S. Cl.
CPC ........ *H01L 21/6831* (2013.01); *H01L 21/687* (2013.01); *H10D 64/017* (2025.01)

(56) References Cited

U.S. PATENT DOCUMENTS

| | | | |
|---|---|---|---|
| 8,226,772 B2 * | 7/2012 | Greeley | ............ H01L 21/67057 134/1 |
| 8,492,009 B1 | 7/2013 | Homola | |
| 2003/0132103 A1 | 7/2003 | Kobata | |
| 2004/0226654 A1 | 11/2004 | Hongo | |
| 2004/0231989 A1 | 11/2004 | Kobata et al. | |
| 2006/0118132 A1 | 6/2006 | Bergman et al. | |
| 2006/0207889 A1 | 9/2006 | Staud | |
| 2010/0170531 A1 | 7/2010 | Greeley | |
| 2010/0187126 A1 | 7/2010 | Sendelbach et al. | |
| 2015/0325772 A1 | 11/2015 | Boukai et al. | |
| 2017/0121842 A1 | 5/2017 | Wang | |
| 2017/0221894 A1 | 8/2017 | Liu | |
| 2018/0171226 A1 | 6/2018 | Yang et al. | |

OTHER PUBLICATIONS

Ombaba et al., "Wet Chemical and Electrochemical Etching Processes" Springer Science + Business Media Dordrecht 2015 B. Bhushan (ed.), Encyclopedia of Nanotechnology, 2015.

* cited by examiner

WET ETCH APPARATUS

PRIORITY CLAIM AND CROSS-REFERENCE

This application is a divisional application of U.S. patent application Ser. No. 17/460,209, filed Aug. 28, 2021, which is a divisional application of U.S. patent application Ser. No. 16/437,775, filed Jun. 11, 2019, now U.S. Pat. No. 11,107,707, issued Aug. 31, 2021, which claims priority to U.S. Provisional Application Ser. No. 62/771,461, filed Nov. 26, 2018, the entirety of which is incorporated by reference herein in their entireties.

BACKGROUND

Process of manufacturing semiconductor devices involves a wide variety of steps including a layer formation process for forming multiple layers such as a polycrystalline layer, an oxide layer, a nitride layer, a metal layer, etc. on a wafer as a semiconductor substrate. These steps generally also include a diffusion process, a photolithography process, an etching process, a cleaning process, an ion implantation process, and the like, which are carried out between the steps of layer formation. Etching is a process, in which selected material is removed from a silicon substrate or from thin films on the substrate surface. Etching can be performed through wet etching using wet chemical. In a wet etching process, the substrate is etched through exposure to a liquid etchant. The liquid etchant removes a predetermined amount of the uncovered or unreacted material and, thereby, forms patterns in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
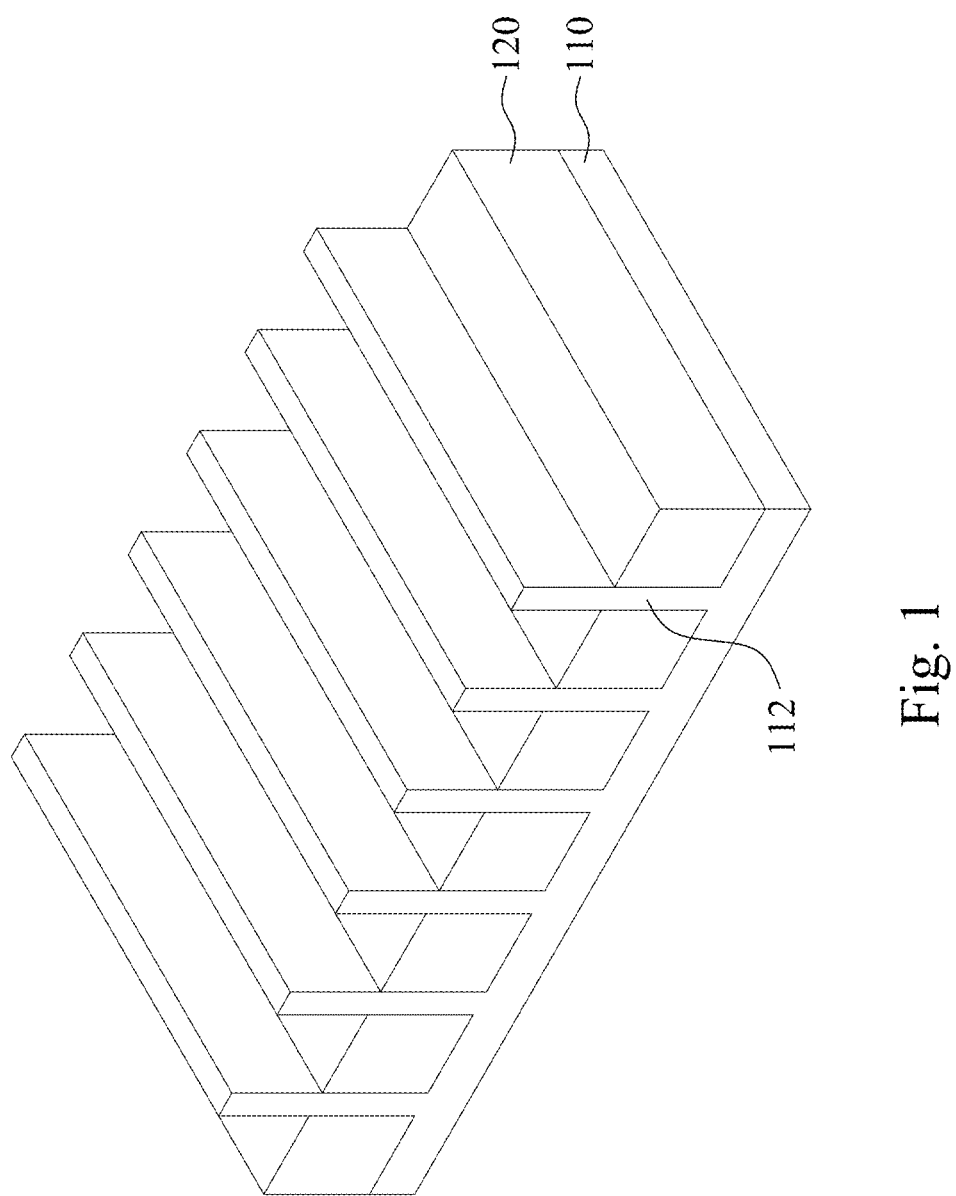
FIGS. 1-12C illustrate perspective views and cross-sectional views of a method of manufacturing a semiconductor device at various stages in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Wet etch is a process that uses a chemical solution, which contains liquid etchants, to remove materials from the surface of a target such as, for example, a wafer. A wet etch process can involve multiple chemical reactions that consume the original reactants and produce new reactants and byproducts. The wet etch process can be divided into three steps: (1) diffusion of the liquid etchant to the "target" material; (2) the chemical reaction between the liquid etchant and the target material; and (3) diffusion of the byproducts in the solution, away from the surface where the chemical reaction occurred. Wet etch processes are used in chip manufacturing at various wafer fabrication stages to selectively remove materials from the wafer's surface.

As dimensions of circuits and devices are scaled-down, wet etching becomes more difficult because the chemical solutions tend to fill the reduced space between adjacent structures, thereby blocking further etching of the underlying target structure. As a result, the wet etching may not etch through the target structure, and this situation may be referred to as under-etching. Moreover, if the liquid etchant successfully etches through the target structure, it may also etch laterally because of its intrinsically isotropic property, which may result in over-etching. In some embodiments of the present disclosure, a wet etch apparatus uses an electric field for inducing the chemical solution to diffuse in one or more desired directions and reducing or increasing the surface tension of the chemical solution, thereby control the directionality of wet etching. Through the design, directional wet etching (for example, lateral etching or vertical etching) can be achieved, and the under-etching or over-etching issue can be addressed by the directional wet etching.

The following disclosure will continue with exemplary FinFET fabrication to illustrate various embodiments of the present disclosure. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. It is understood, however, that the application should not be limited to a particular type of device. In some examples, wet etch can be used to form recesses in a semiconductor substrate so that source/drain regions (e.g., n-type or p-type epitaxy features) can be formed in recesses of the semiconductor substrate. In some examples, wet etch can be used to remove polycrystalline silicon (polysilicon) from a sacrificial dummy gate stack, so that it can be replaced with a metal gate.

FIGS. 1-12C illustrate a method of manufacturing a semiconductor device at various stages in accordance with some embodiments. Reference is made to FIG. 1. A substrate 110 including plural semiconductor fins 112 is formed. The substrate 110 may be a bulk silicon substrate. Alternatively, the substrate 110 may include an elementary semiconductor, such as silicon (Si) or germanium (Ge) in a crystalline structure; a compound semiconductor, such as silicon germanium (SiGe), silicon carbide (SiC), gallium arsenic (GaAs), gallium phosphide (GaP), indium phosphide (InP), indium arsenide (InAs), and/or indium antimonide (InSb); or combinations thereof. Possible substrates 110 also include a silicon-on-insulator (SOI) substrate. SOI substrates are fabricated using separation by implantation of oxygen (SIMOX), wafer bonding, and/or other suitable methods.

The substrate 110 may also include various doped regions. The doped regions may be doped with p-type dopants, such as boron or $BF_2$; n-type dopants, such as phosphorus or arsenic; or combinations thereof. The doped regions may be formed directly on the substrate 110, in a P-well structure, in an N-well structure, in a dual-well structure, and/or using a raised structure. The substrate 110 may further include various active regions, such as regions configured for an N-type metal-oxide-semiconductor transistor device and regions configured for a P-type metal-oxide-semiconductor transistor device.

The semiconductor fins 112 may be formed by any suitable method. For example, the semiconductor fins 112 may be formed by using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate 110 and patterned using a photolithography process. Spacers are formed alongside the patterned sacrificial layer using a self-aligned process. The sacrificial layer is then removed, and the remaining spacers may then be used to pattern the fins.

A plurality of isolation structures 120 are formed over the substrate 110 and adjacent to the semiconductor fins 112. The isolation structures 120, which act as a shallow trench isolation (STI) around the semiconductor fins 112 may be formed by chemical vapor deposition (CVD) techniques using tetra-ethyl-ortho-silicate (TEOS) and oxygen as a precursor. In some other embodiments, the isolation structure 120 is insulator layers of a SOI wafer.

Figure 2:
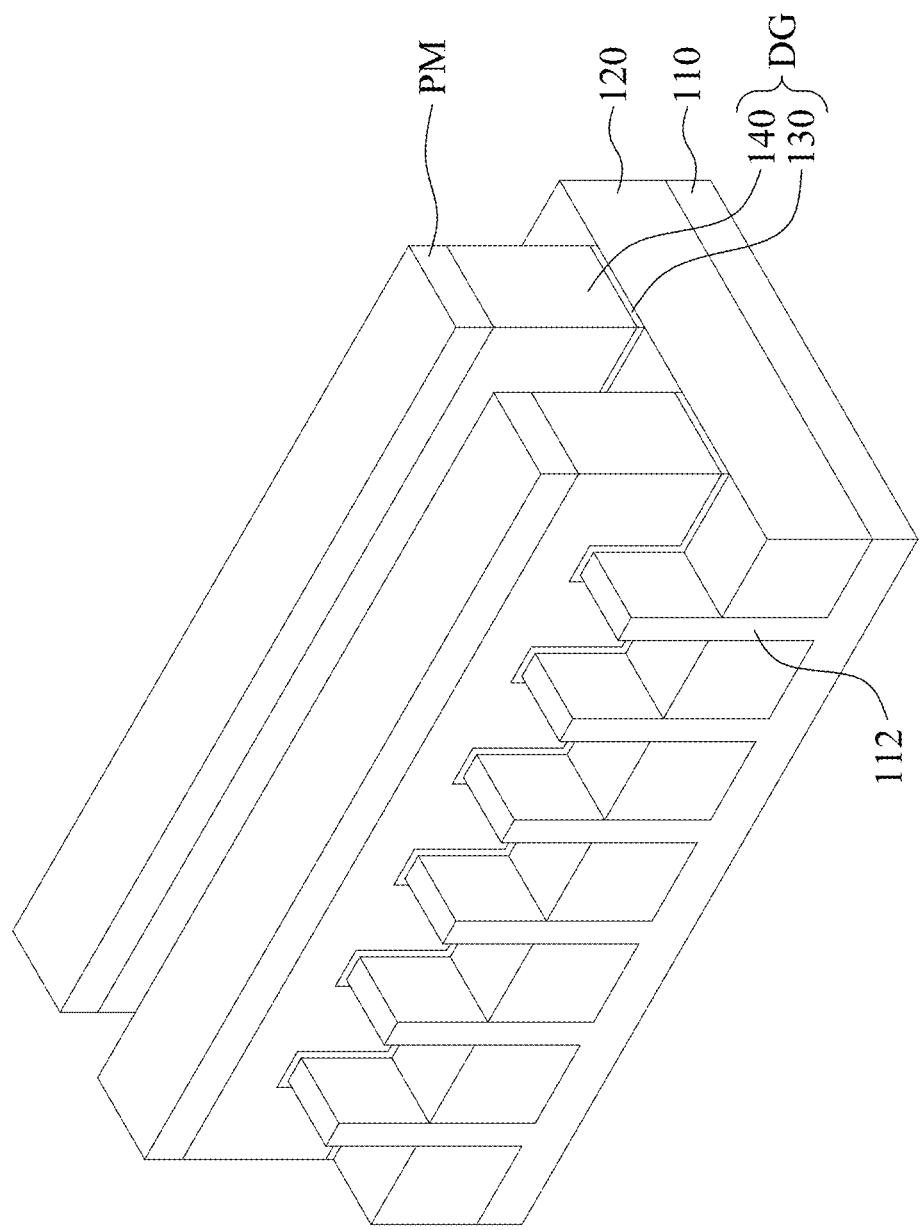

Reference is made to FIG. 2. A plurality of dummy gate stacks DG are formed around the semiconductor fins 112 of the substrate 110. In some embodiments, each of the dummy gate stack DG includes a dummy gate electrode 140 and a gate dielectric 130 underlying the dummy gate 140. The dummy gate electrodes 140 may include polycrystalline-silicon (poly-Si) or poly-crystalline silicon-germanium (poly-SiGe). Further, the dummy gate electrodes 140 may be doped poly-silicon with uniform or non-uniform doping.

The gate dielectrics 130 include dielectric materials having a high-k dielectric constant, for example, greater than that of thermal silicon oxide (~3.9). For example, the high-k dielectric materials of the gate dielectrics 130 may be metal oxides, metal nitrides, metal silicates, transition metal-oxides, transition metal-nitrides, transition metal-silicates, oxynitrides of metals, metal aluminates, zirconium silicate, zirconium aluminate, or combinations thereof. The gate dielectrics 130 may include high-k dielectrics, such as $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The gate dielectrics 130 may be formed by ALD, PVD, CVD, oxidation, and/or other suitable methods.

In some embodiments, the dummy gate stacks DG may be formed by, for example, forming a stack of a gate dielectric layer and a dummy gate material layer over the substrate 110, followed by patterning the stack of the gate dielectric layer and the dummy gate material layer using one or more etching processes, such as one or more dry plasma etching processes or one or more wet etching processes. A patterned mask PM is formed over the stack of gate dielectric layer and dummy gate material layer to serve as an etch mask in the patterning process. At least one parameter, such as etchant, etching temperature, etching solution concentration, etching pressure, source power, radio frequency (RF) bias voltage, etchant flow rate, of the patterning (or etching) recipe can be tuned. For example, dry etching process, such as plasma etching, may be used to etch the dummy gate material layer and the gate dielectric layer until the semiconductor fins 112 are exposed.

Figure 3A:
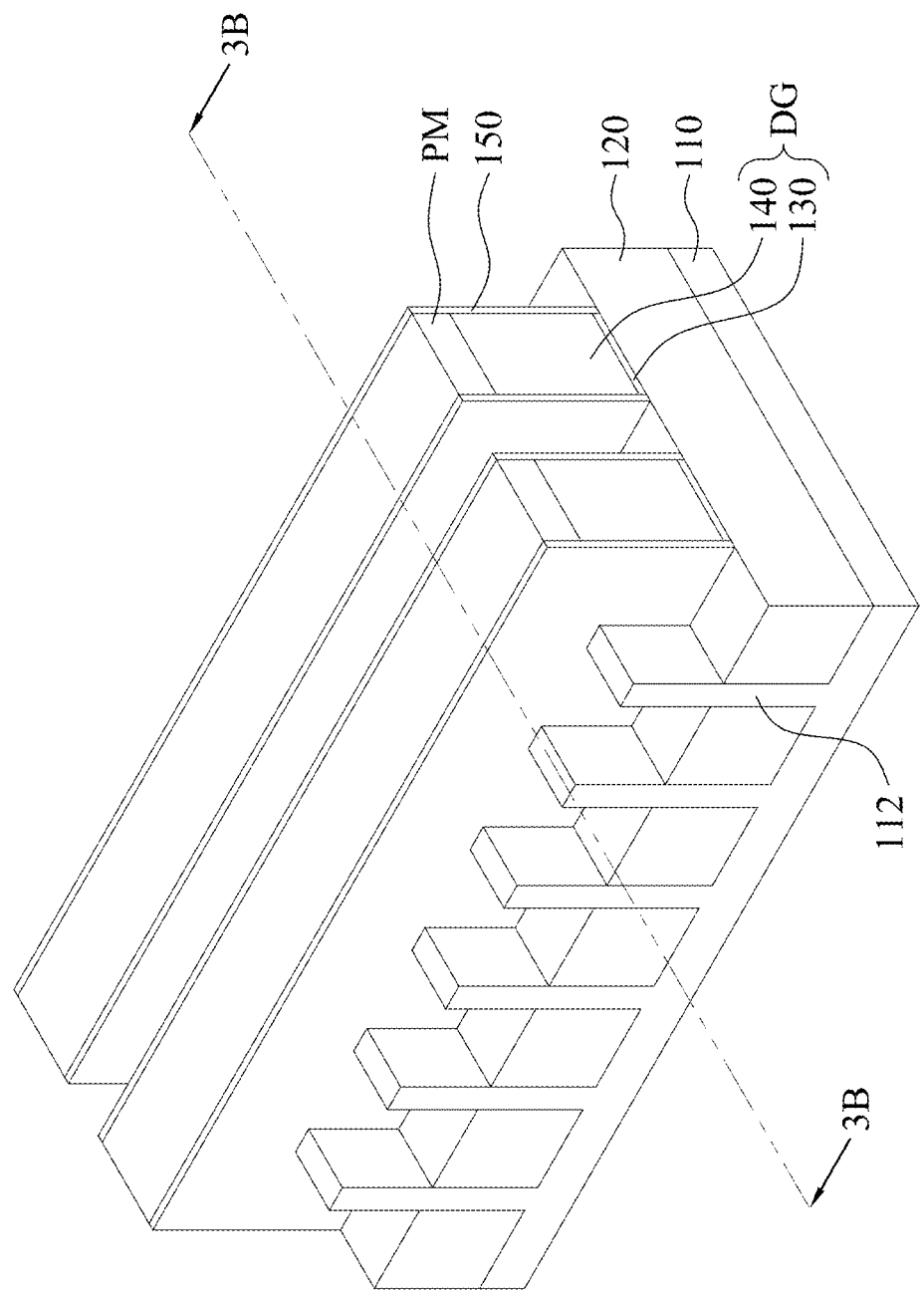
Figure 3B:
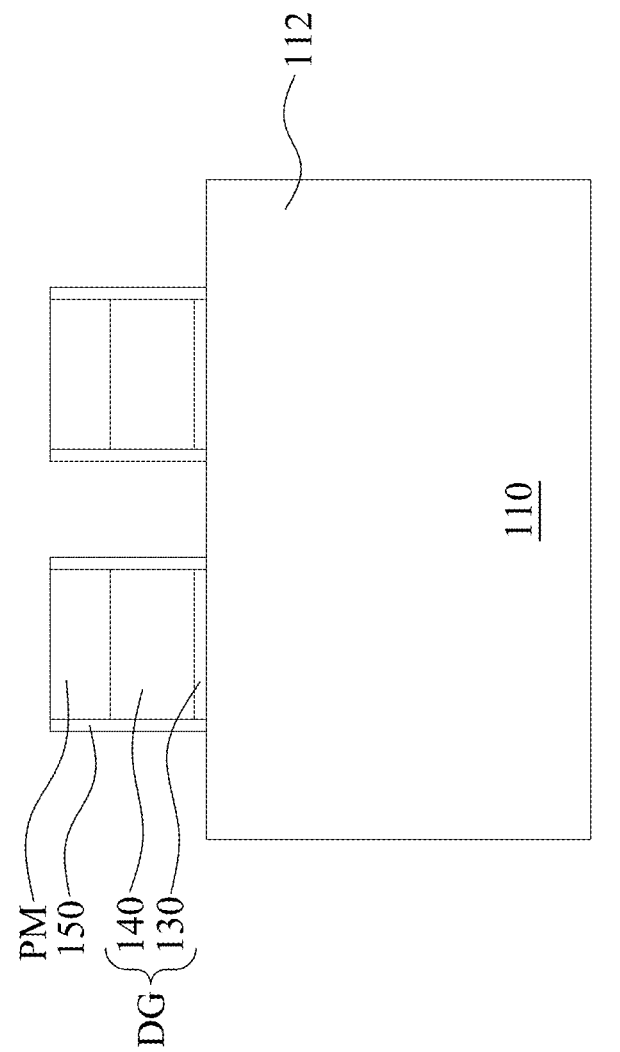
Figure 4A:
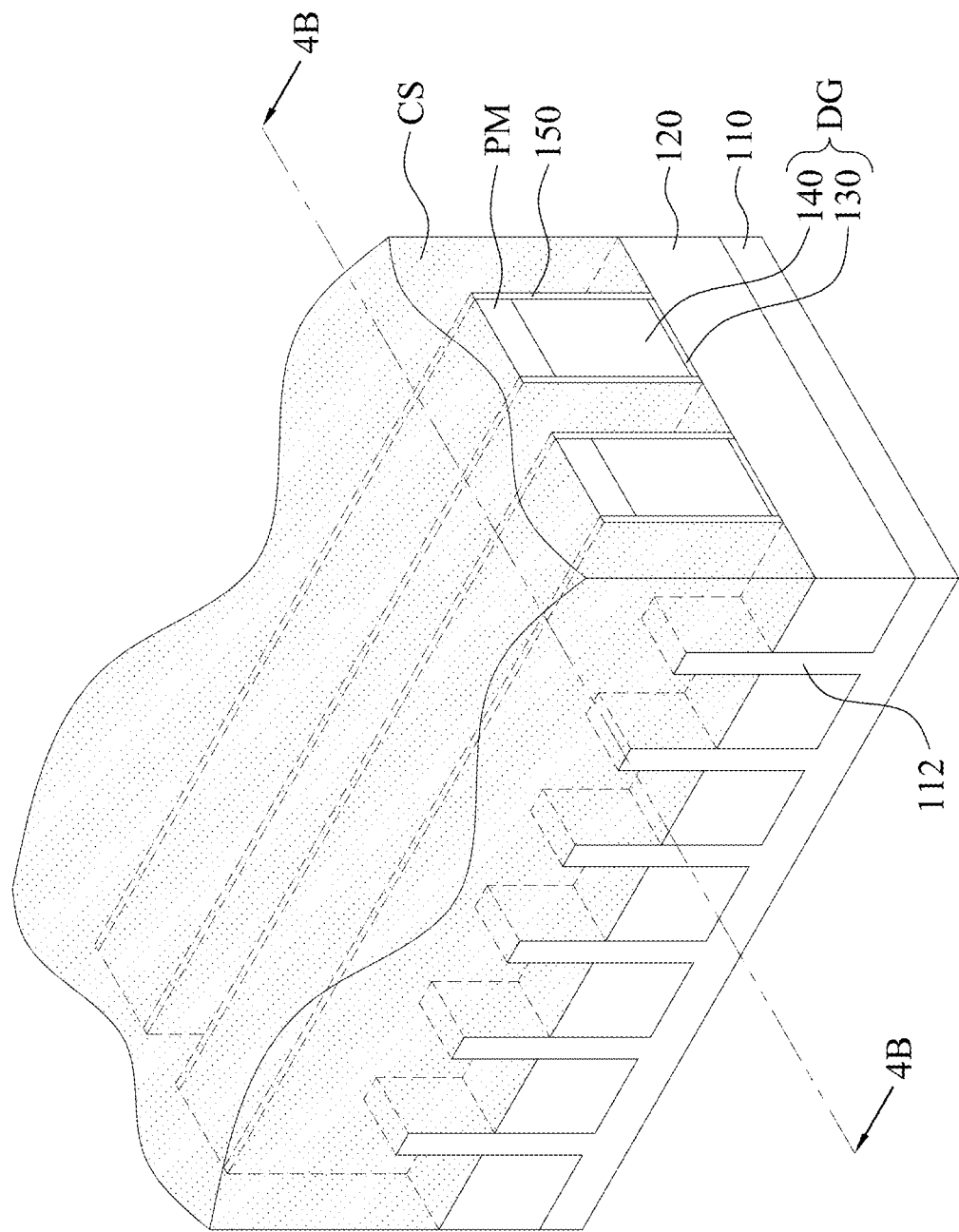
Figure 4B:
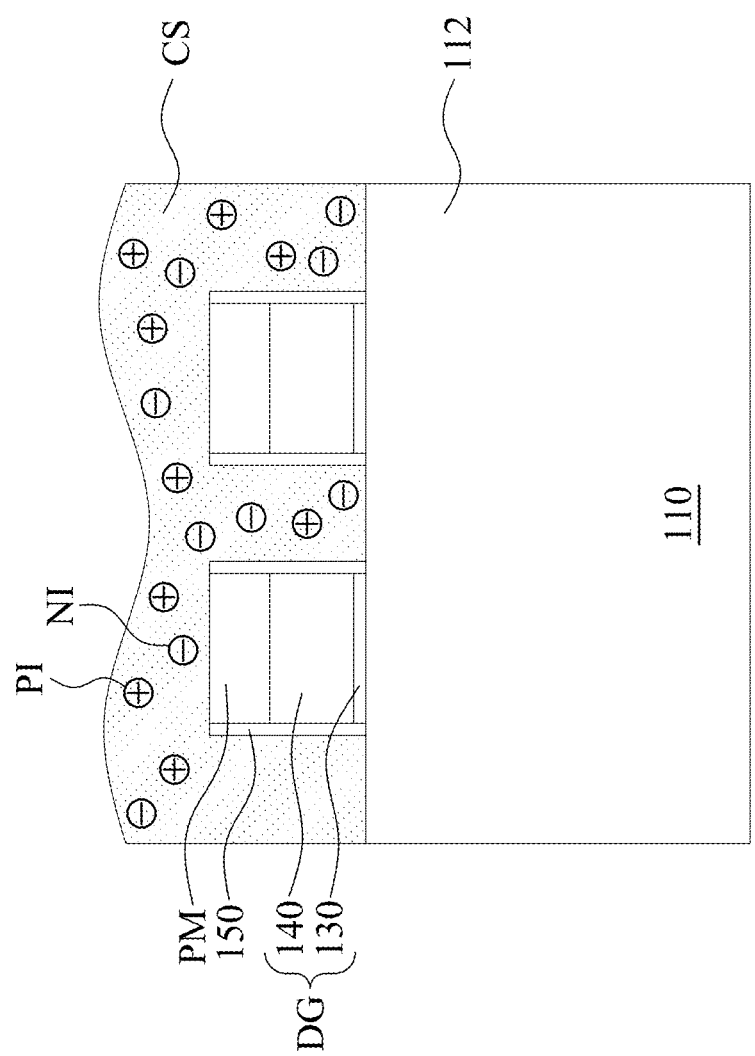

Reference is made to FIGS. 3A and 3B. FIG. 3B is a cross-sectional view taken along line 3B-3B in FIG. 3A. A plurality of gate spacers 150 are formed respectively on opposite sidewalls of the dummy gate stacks DG. In some embodiments, at least one of the gate spacers 150 includes single or multiple layers. The gate spacers 150 can be formed by blanket depositing one or more dielectric layers (not shown) on the structure shown in FIG. 2, followed by performing anisotropic etching to remove horizontal portions of the one or more dielectric layers. The remaining portions of the dielectric layers are referred to as gate spacers 150. The one or more dielectric layers may include silicon nitride (SiN), oxynitride, silicon carbon (SiC), silicon oxynitride (SiON), oxide, and the like. The dielectric layer(s) may be formed by suitable deposition methods such as CVD, plasma enhanced CVD, sputter, or the like.

Figure 14A:
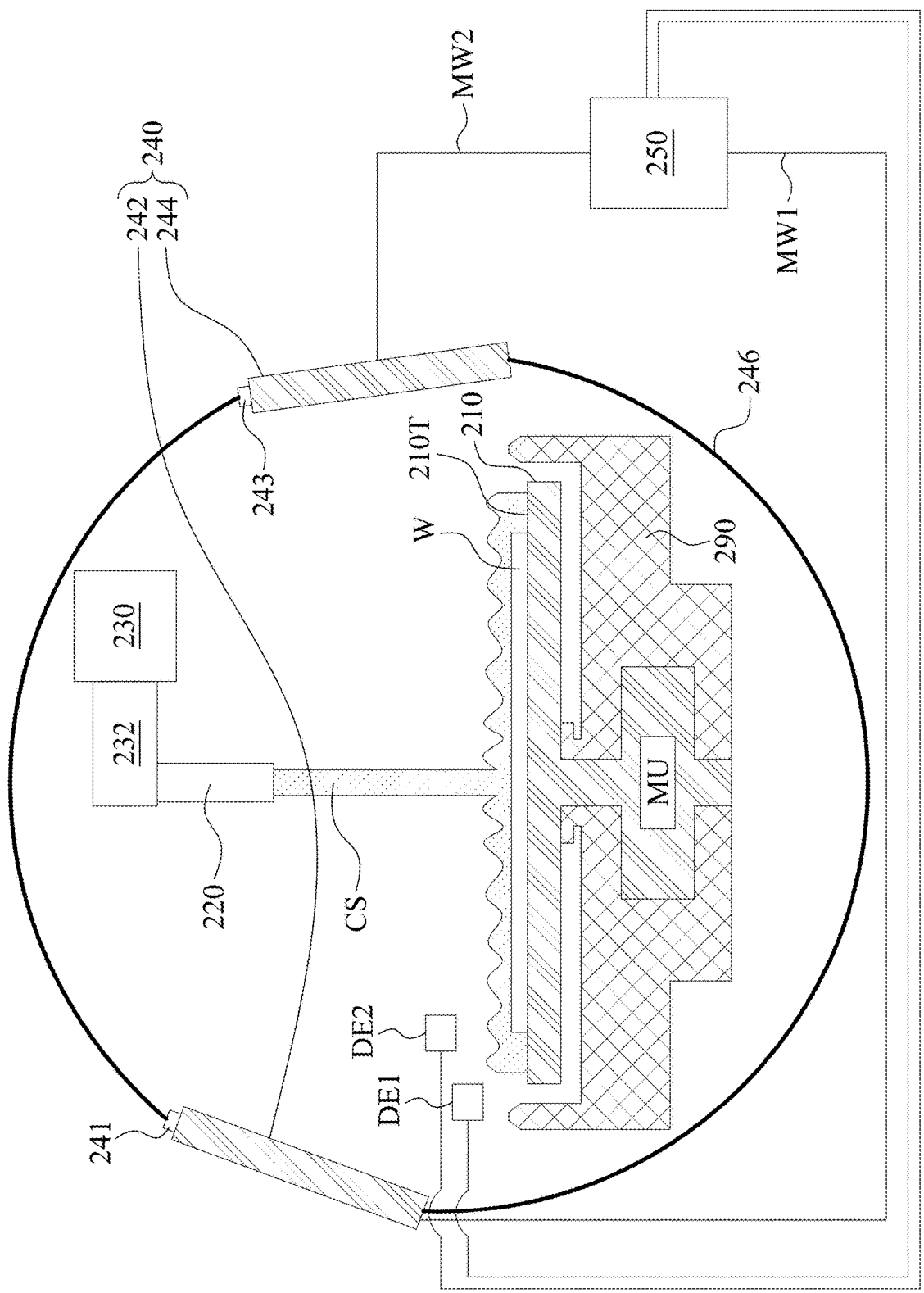
FIG. 14A is a schematic cross-sectional view of a wet etch apparatus according to some embodiments of the present disclosure.
Figure 14B:
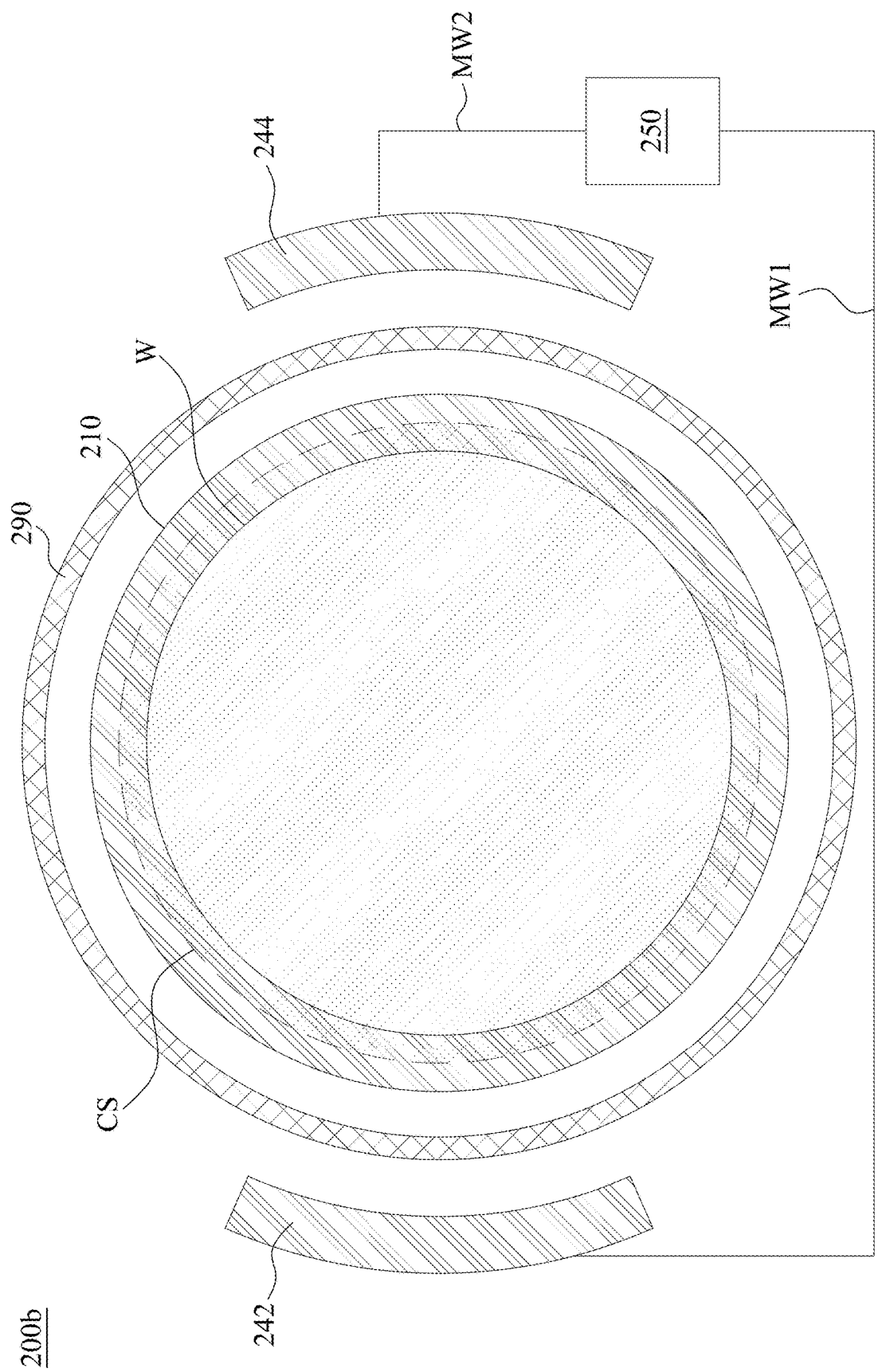
FIG. 14B is a schematic top view of a wet etch apparatus according to some embodiments of the present disclosure.

FIGS. 4A-6B illustrate recessing the semiconductor fins 122 using an improved wet etching process in accordance with some embodiments. The wet etching process is performed to remove portions of the semiconductor fins 112 uncovered by the dummy gate stacks DG and gate spacers 150, thereby forming plural recesses R1 in the semiconductor fins 112 of the substrate 110. In the present embodiments, the improved wet etching process is performed using a wet etch apparatus 200b as illustrated in FIGS. 14A and 14B that can enhance the etching in certain direction, for example, enhancing lateral etching rate. For clear illustration, it is noted that the wafer W in FIGS. 14A and 14B includes the structure as shown in FIGS. 3A and 3B.

In the etching process, a chemical solution CS is dispensed from a dispensing nozzle 220 (referring to FIGS. 14A and 14B) onto the substrate 110 (referring to FIGS. 4A and 4B) of the wafer W. The chemical solution CS may include liquid etchants for etching the fins 112. To be specific, the liquid etchant in the chemical solution CS reacts with the fins 112, and produces new reactants and byproducts in the solution CS. For example, the liquid etchant in the chemical solution CS may include a mixture of $HNO_3$ and HF (hydrofluoric acid), other suitable wet etching solutions, or combinations thereof for isotropic etching. In some other embodiments, the liquid etchant in the chemical solution CS may include NH$_4$OH, KOH (potassium hydroxide), TMAH (tetramethylammonium hydroxide), other suitable wet etching solutions, or combinations thereof for anisotropic etching. The chemical solution CS may include a solvent (e.g., H$_2$O) to dissolve to etchants. The chemical solution CS may include charged ions, such as positive ions PI (e.g., H$^+$) and negative ions NI (e.g., OH$^-$) which dissociate from the solvent and the etchants. In some embodiments, the chemical solution CS may include polar molecules, such as H$_2$O.

Figure 5A:
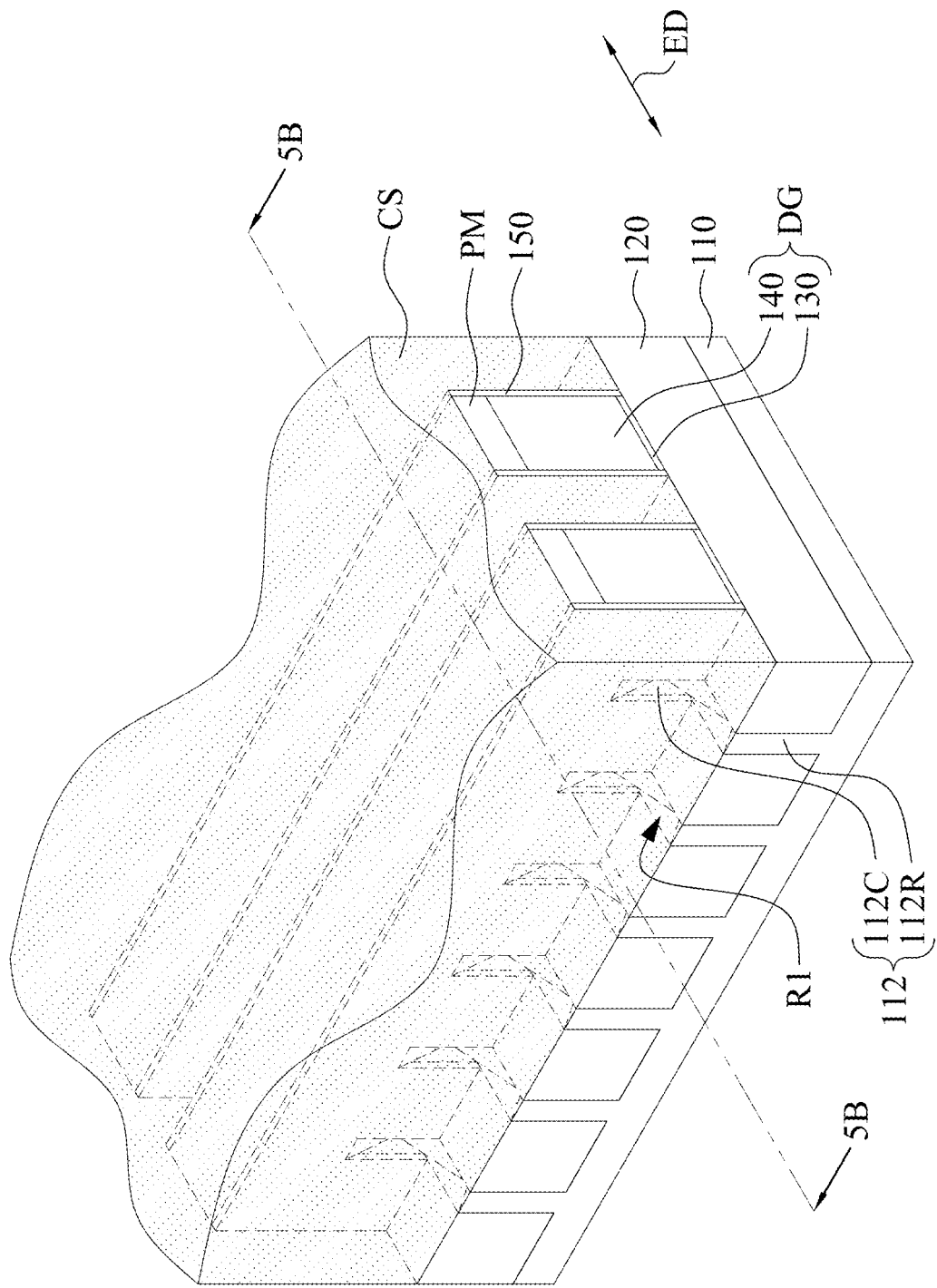
Figure 5B:
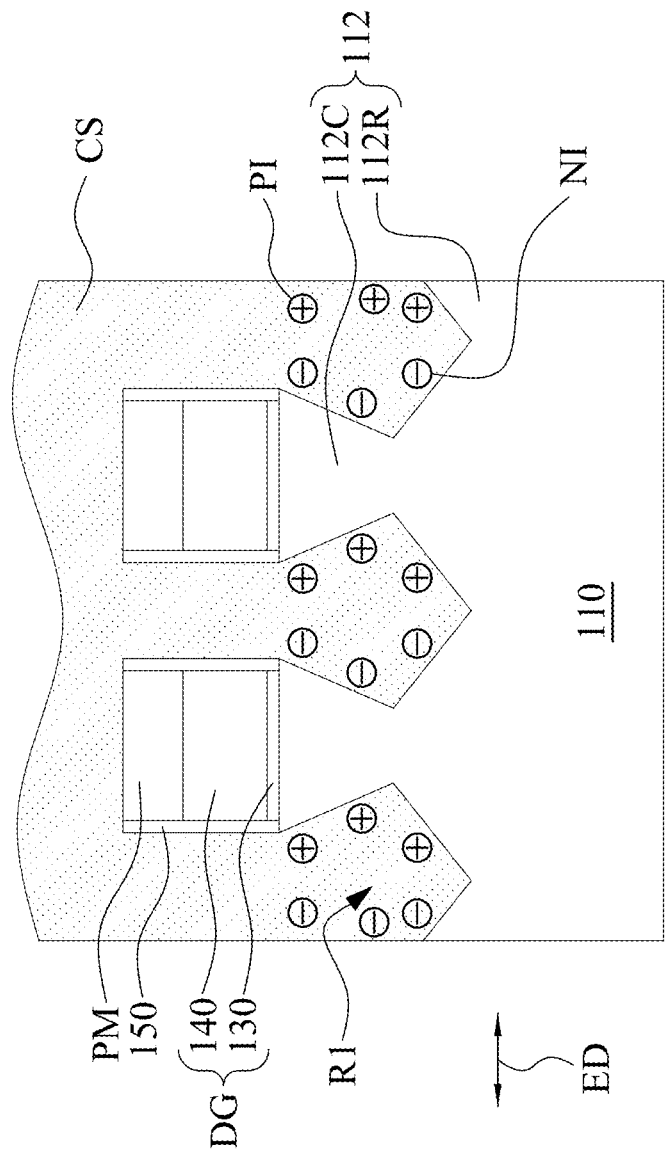

As time passes, portions of the semiconductor fins 112 uncovered by the dummy gate stacks DG and the gate spacers 150 are removed due to the chemical reaction between the chemical solution CS and the fins 112, thus forming recesses R1 in the semiconductor fins 112. The resultant structure is illustrated in FIGS. 5A and 5B. Each of the remaining semiconductor fins 112 include recessed portions 112R uncovered by the dummy gate stacks DG and the gate spacers 150 and channel portions 112C covered by the respective dummy gate stacks DG.

In some embodiments, an electric field is generated across the substrate 110 when the chemical solution CS reacts with the fins 112, thereby inducing the positive ions PI, the negative ions NI, and/or the polar molecules in the solution CS to move laterally, such that the solution CS may diffuse laterally, which in turn will enhance lateral etching rate and achieving desired profiles for the recesses R1 in the semiconductor fin 112, thus improving the source/drain proximity (i.e., a distance between the subsequently formed source/drain epitaxy structures in the recesses R1). The electric field may be in a range of from about 300 k V/m to about 600 kV/m. The contact angle and the surface tension of the solution CS on the substrate 110 is changed with the electric field. For example, in some embodiments, the contact angle and the surface tension of the solution CS may be reduced with increasing the electric field in the range of from about 300 k V/m to about 600 k V/m. If the electric field is less than about 300 k V/m, the resultant force on the positive ions PI, the negative ions NI, and/or the polar molecules in the solution CS might be too weak to influence the etching process for forming the desired diamond-shaped recesses R1. If the electric field is greater than about 600 k V/m, the contact angle and the surface tension of the solution CS may turn to be increased with increasing the electric field, rather than reduced as in the range of from about 300 kV/m to about 600 k V/m. This reversal of variation of the contact angle and the surface tension of the solution CS may result in undesired and unpredictable etch behavior and lead to unsatisfactory resultant shape. The electric field may be uniform or nonuniform.

In some other embodiments, the contact angle and the surface tension of the solution CS may be increased with increasing the electric field in the range of from about 300 k V/m to about 600 k V/m. If the electric field is less than about 300 k V/m, the resultant force on the positive ions PI, the negative ions NI, and/or the polar molecules in the solution CS might be too weak to influence the etching process for forming desired the diamond-shaped recesses R1. If the electric field is greater than about 600 kV/m, the contact angle or the surface tension of the solution CS may be reduced with increasing the electric field, rather than increased as in the range of from about 300 kV/m to about 600 k V/m. This reversal of variation of the contact angle and the surface tension of the solution CS may result in undesired and unpredictable etch behavior and lead to unsatisfactory resultant shape.

As shown in FIG. 5B, a direction ED of the electric field may be adjusted according to desired profile of recesses R1. For example, in some embodiments, the direction ED of the electric field may be parallel with the longitudinal axes of the fins 112 for enhancing the fin etching rate in a direction parallel with the longitudinal axes of the fins 112. In such embodiments, the fin etching rate in a direction perpendicular to the longitudinal axes of the fins 112 and parallel to the longitudinal axes of the dummy gate stacks DG (i.e., the direction extending into and out of the plane of the page of FIG. 5B) is slower than the fin etching rate in a direction parallel with the longitudinal axes of the fins 112. In some other embodiments, the direction ED of the electric field may be designed to be parallel with the longitudinal axes of the dummy gate stacks DG (i.e., the direction extending into and out of the plane of the page of FIG. 5B) for enhancing the fin etching rate in this direction. In such embodiments, the fin etching rate in the direction parallel with the longitudinal axes of the fins 112 is slower than the fin etching rate in the direction perpendicular to the longitudinal axes of the fins 112 (i.e., the direction extending into and out of the plane of the page of FIG. 5B). In some embodiments, the wafer W is spun during the etching process with the electric field, such that the direction ED of the electric field experienced by the wafer W will change between the longitudinal axes of the fins 112 and the longitudinal axes of the dummy gate stacks DG. Moreover, as shown in FIG. 5B, the direction ED of the electric field is parallel with a top surface of the substrate 110 or a top surface 210T of the wafer chuck 210 (as shown in FIG. 14A). In some other embodiments, the wafer W remains stationary during the etching process, and the direction ED of the electric field may remain in parallel with the longitudinal axes of the fins 112 or the longitudinal axes of the dummy gate stacks DG. Through controlling the electric field during the wet etching process, portions of the semiconductor fins 112 covered by the dummy gate stacks DG are also removed to form the recesses R1, such that the channel portion 112C has a waist that narrower than the dummy gate stacks DG. In this way, the source/drain proximity can be improved.

The electric field may be an alternating-current (AC) electric fields or a direct-current (DC) electric fields. The wafer W may remain stationary or keep spinning during applying AC or DC electric fields. In some embodiments where the wafer W is kept stationary during applying the AC electric field, the positive ions PI and/or the negative ions NI reciprocate (i.e., move back and forth) in the recess R1, such that the wet etching rate is enhanced in two opposite directions (e.g., as indicated by double-headed arrow ED) along the longitudinal axis of the semiconductor fin 112, as illustrated in FIG. 5B. In some embodiments where the wafer W is kept stationary during applying the DC electric field, the positive ions PI and/or the negative ions NI in the recess R1 tend to move in a single direction, rather than two opposite directions resulting from the AC electric field. In this way, the wet etching can be enhanced in a single direction if the DC electric field is applied on the stationary wafer W. In some embodiments where the wafer W keeps spinning during either applying AC field or DC field, the direction ED of the electric field experienced by the wafer W will continuously change from the longitudinal axes of the fins 112 to the longitudinal axes of the dummy gate stacks DG, and thus the chemical solution CS will be moved (i.e., diffused) in different directions as time passes by using the force resulting from the AC or DC field, such that the wet etching rate is enhanced in different directions as time passes.

Although the etching rate discussed above is laterally enhanced by the electric field, in some other embodiments, the direction of the electric field may be controlled to be substantially perpendicular to the top surface of the substrate 110 for enhancing vertical etching rate.

In the present embodiments, the wet etching process may be a selective wet etch. For example, in some embodiments, the isolation structures 120 has higher etch resistance to the liquid etchant than that of the fins 112, such that the isolation structures 120 remains substantially intact after the etching processes. In some embodiments, the gate spacers 150 have higher etch resistance to the liquid etchant than that of the fins 112. In some embodiments, the spacers 150 have higher etch resistance than that of the dummy gate electrodes 140, such that the spacers 150 protect sidewalls of the dummy gate electrodes 140 from being etched. In some embodiments, the mask PM has higher etch resistance to the liquid etchant than that of the dummy gate electrodes 140, such that the mask PM protects top surfaces of the dummy gate electrodes 140 from being etched.

Figure 6A:
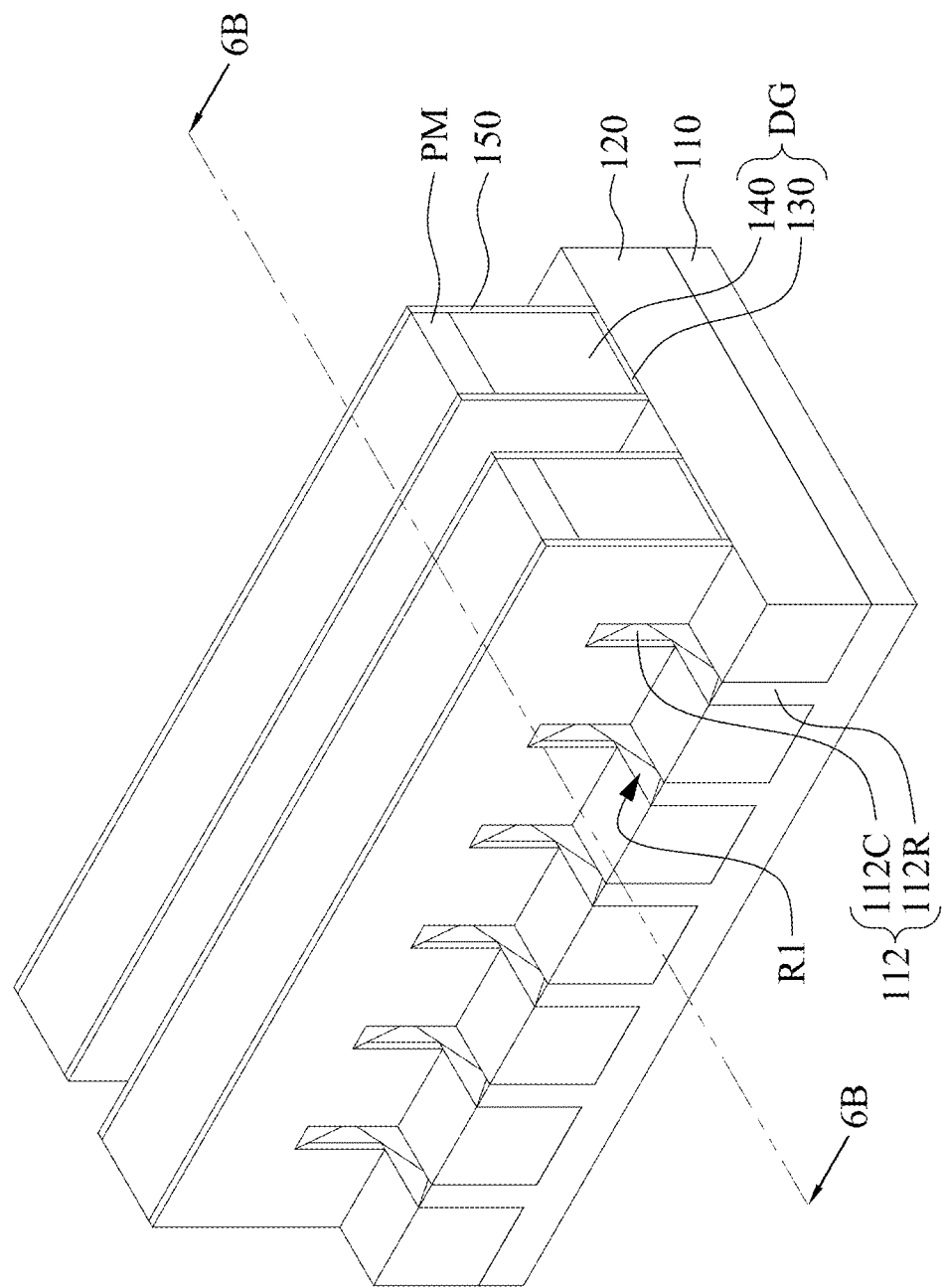
Figure 6B:
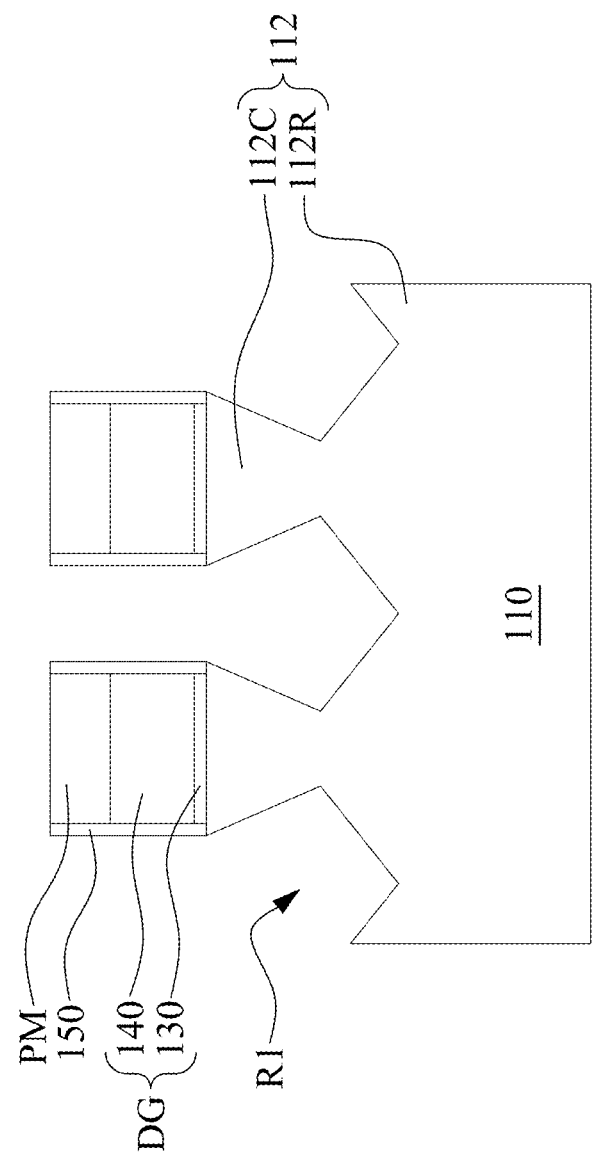

Reference is made to FIGS. 6A and 6B. FIG. 6B is a cross-sectional view taken along line 6B-6B in FIG. 6A. After the wet etching process, a pre-cleaning process may be performed to clean the recesses R1 with hydrofluoric acid (HF) or other suitable solution in some embodiments. For example, a cleaning agent (e.g., hydrofluoric acid (HF) or other suitable solution) may be in-situ applied in the wet etch apparatus 200b (as illustrated in FIGS. 14A and 14B) onto the wafer W for removing the chemical solution CS from the wafer W, followed by a dry process performed to remove the cleaning agent from the recesses R1.

Although the recessing of the semiconductor fins 112 is illustrated as using a wet etching process, it should not limit the scope of the present disclosure. In some other embodiments, the recessing of the semiconductor fins 112 may include a dry etching process or a combination of dry and wet etching processes. The dry etching process may be a selective dry etch. Dry etching processes include a biased plasma etching process that uses a chlorine-based chemistry. Other dry etchant gasses include $CF_4$, $NF_3$, $SF_6$, and He. Dry etching may also be performed anisotropically using such mechanisms as DRIE (deep reactive-ion etching).

Figure 7A:
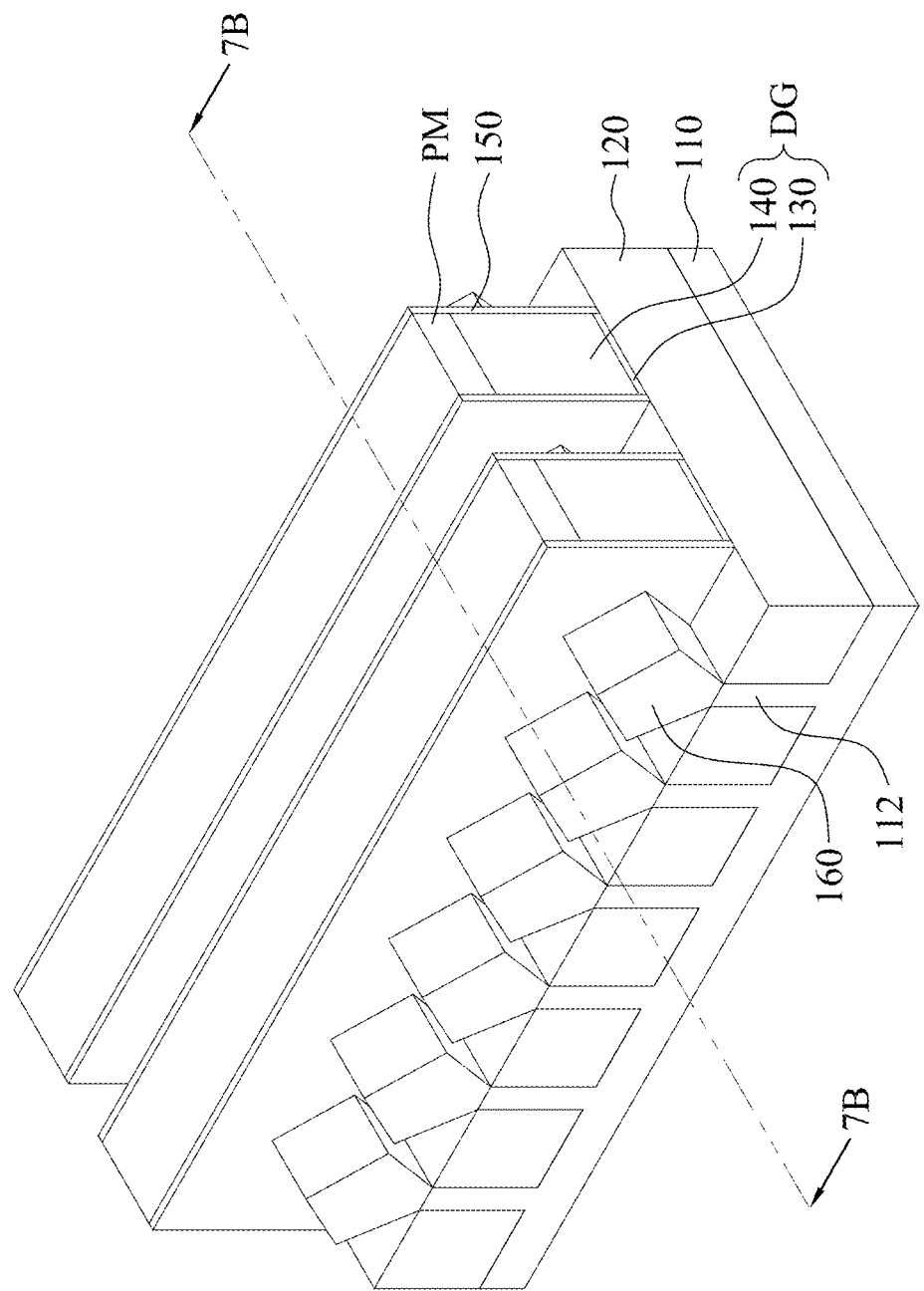
Figure 7B:
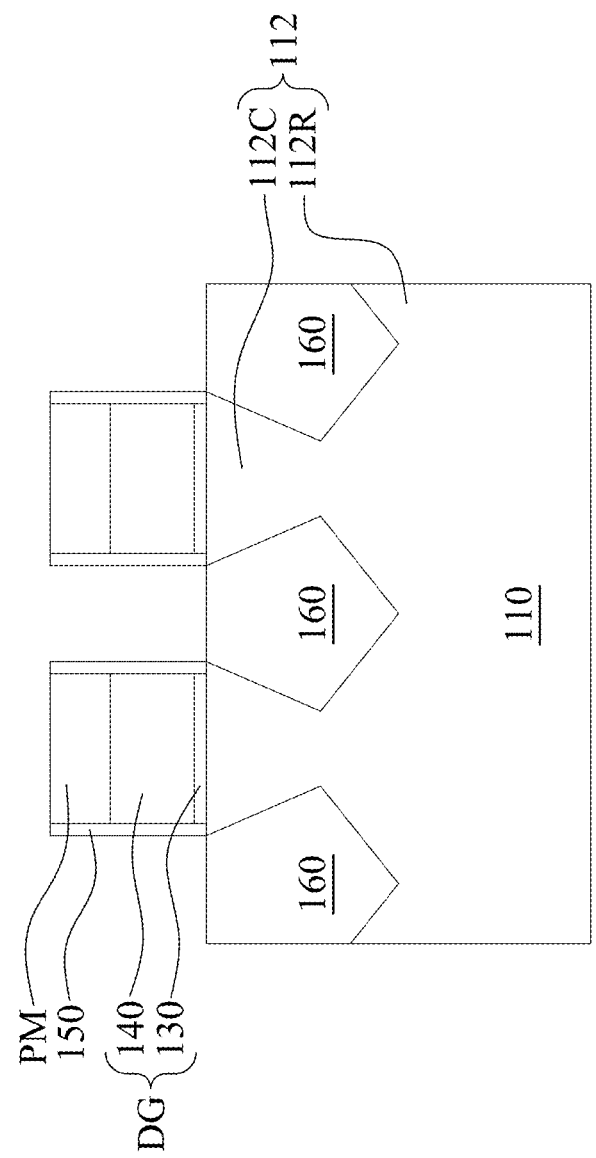

Reference is made to FIGS. 7A and 7B. FIG. 7B is a cross-sectional view taken along line 7B-7B in FIG. 7A. A plurality of source/drain features 160 are respectively formed in the recesses R1 of the semiconductor fins 112 of the substrate 110. Although top surfaces of the source/drain features 160 are illustrated as level with the top surface of the semiconductor fin 112, in some other embodiments, the source/drain features 160 are raised structures having tops surfaces higher than that of the semiconductor fin 112. The source/drain features 160 may be formed using one or more epitaxy or epitaxial (epi) processes, such that Si features, SiGe features, and/or other suitable features can be formed in a crystalline state on the semiconductor fins 112. As a result, the source/drain features 160 may also be interchangeably referred to as epitaxy features 160. In some embodiments, lattice constants of the source/drain features 160 are different from lattice constants of the semiconductor fins 112, such that channels in the channel portions 112C of the semiconductor fins 112 are strained or stressed to enable carrier mobility of the semiconductor device and enhance the device performance. In some embodiments, the source/drain features 160 may include semiconductor material such as germanium (Ge) or silicon (Si); or compound semiconductor materials, such as gallium arsenide (GaAs), aluminum gallium arsenide (AlGaAs), silicon germanium (SiGe), silicon carbide (SiC), or gallium arsenide phosphide (GaAsP).

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 112 (e.g., silicon). The source/drain features 160 may be in-situ doped. The doping species include P-type dopants, such as boron or $BF_2$; N-type dopants, such as phosphorus or arsenic; and/or other suitable dopants including combinations thereof. The source/drain features 160 may be doped with dopants of the same or different conductive types. If the source/drain features 160 are not in-situ doped, a second implantation process (i.e., a junction implant process) is performed to dope the source/drain features 160. One or more annealing processes may be performed to activate the source/drain features 160. The annealing processes include rapid thermal annealing (RTA) and/or laser annealing processes.

Figure 8A:
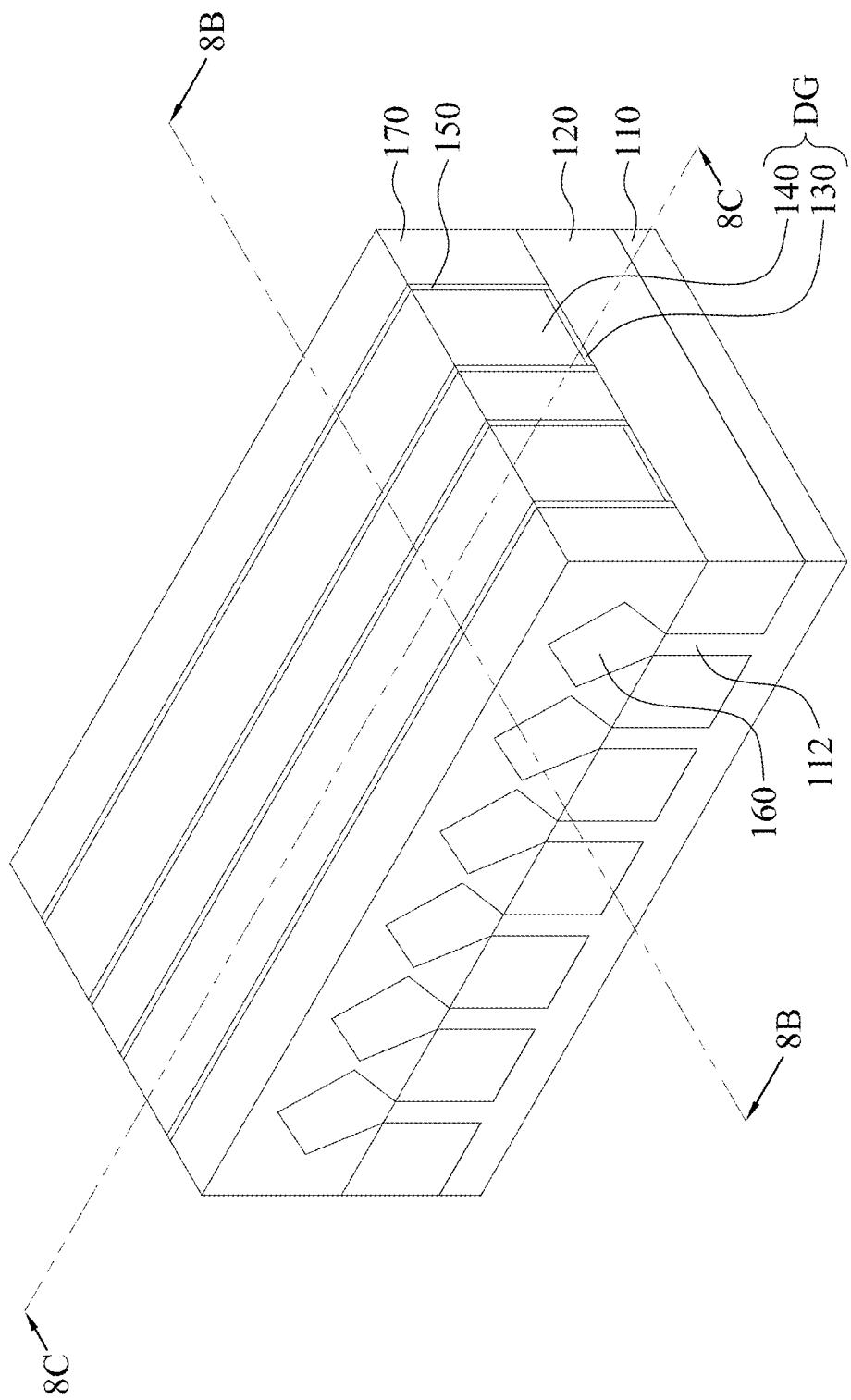
Figure 8B:
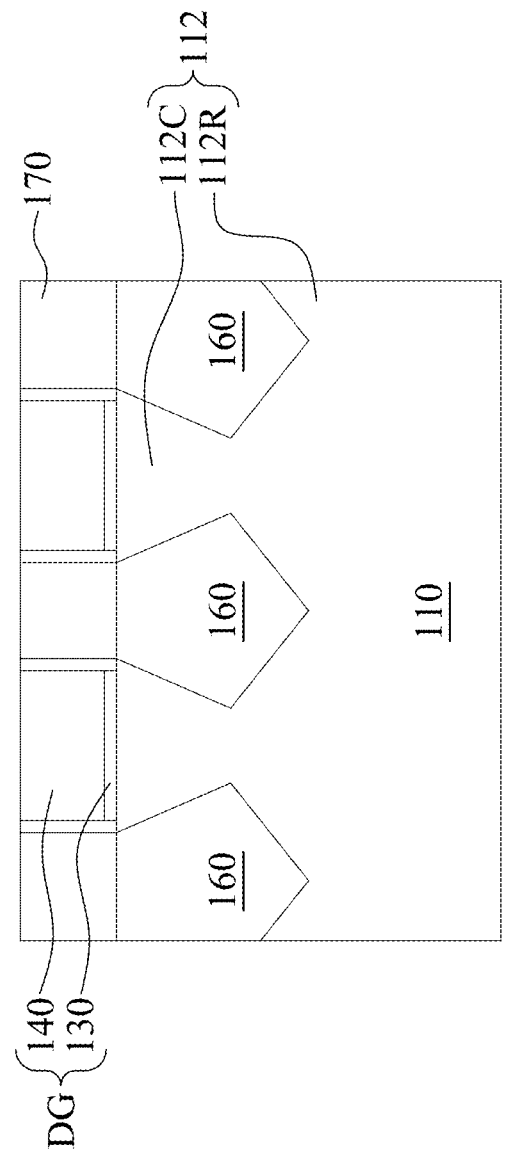
Figure 8C:
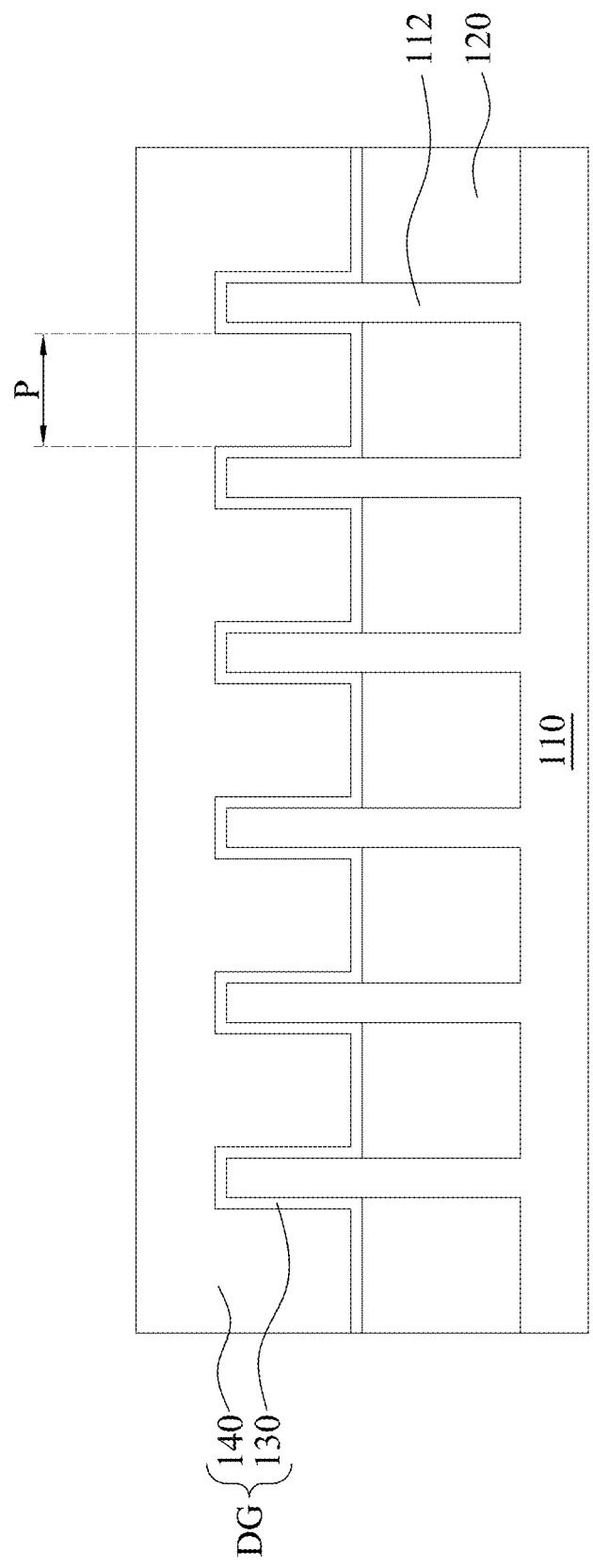

Reference is made to FIGS. 8A-8C. FIG. 8B is a cross-sectional view taken along line 8B-8B in FIG. 8A. FIG. 8C is a cross-sectional view taken along line 8C-8C in FIG. 8A. After the source/drain features 160 are formed, an interlayer dielectric (ILD) 170 is formed over the substrate 110 and surrounding the source/drain features 160. The ILD 170 may include silicon oxide, oxynitride or other suitable materials. The ILD 170 includes a single layer or multiple layers. The ILD 170 can be formed by a suitable technique, such as CVD or ALD. A chemical mechanical polishing (CMP) process may be performed to remove an excess portion of the ILD 170 and the mask PM (referring to FIGS. 7A and 7B) until reaching the dummy gate stacks DG. After the CMP process, the dummy gate stacks DG are exposed from the ILD 170. In some embodiments, a contact etch stop layer (CESL) may be blanket formed over the substrate 110 prior to the formation of the ILD 170.

Figure 10A:
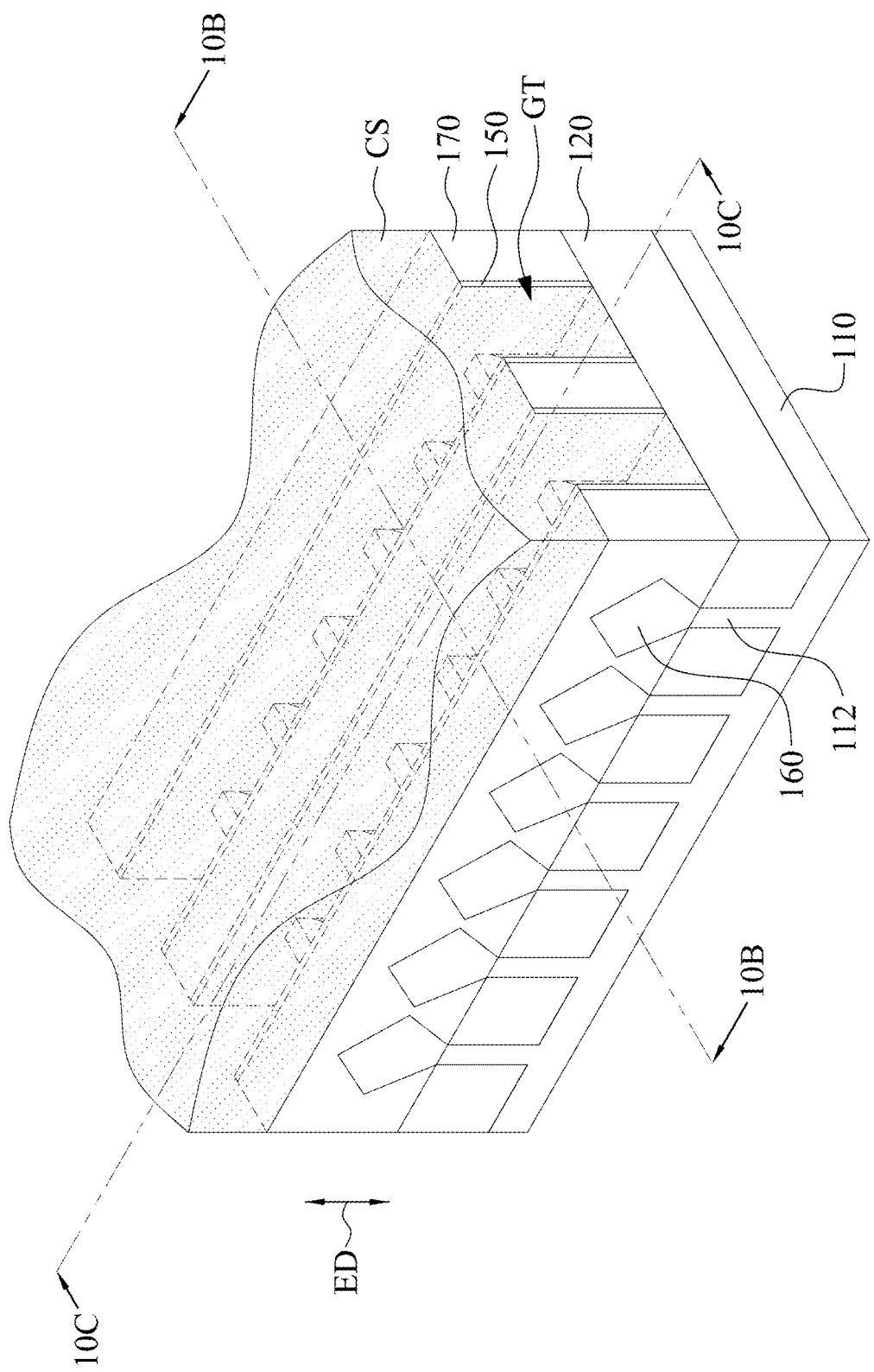
Figure 10B:
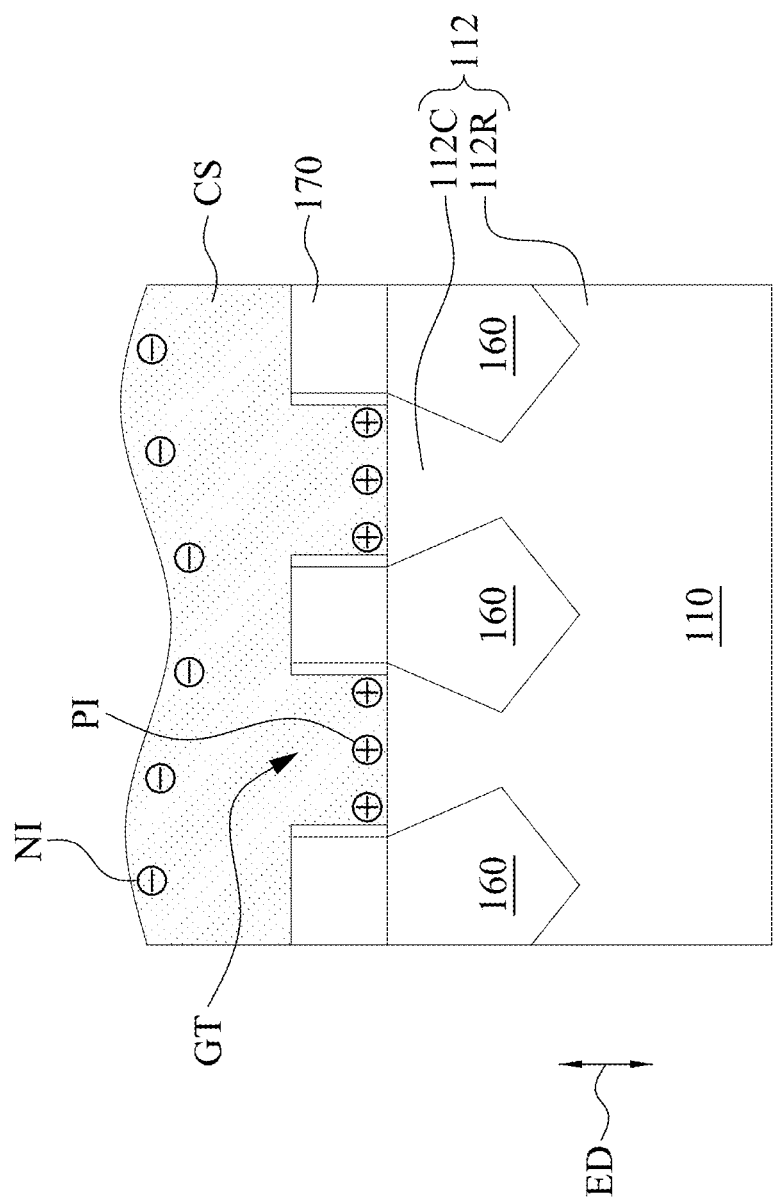
Figure 10C:
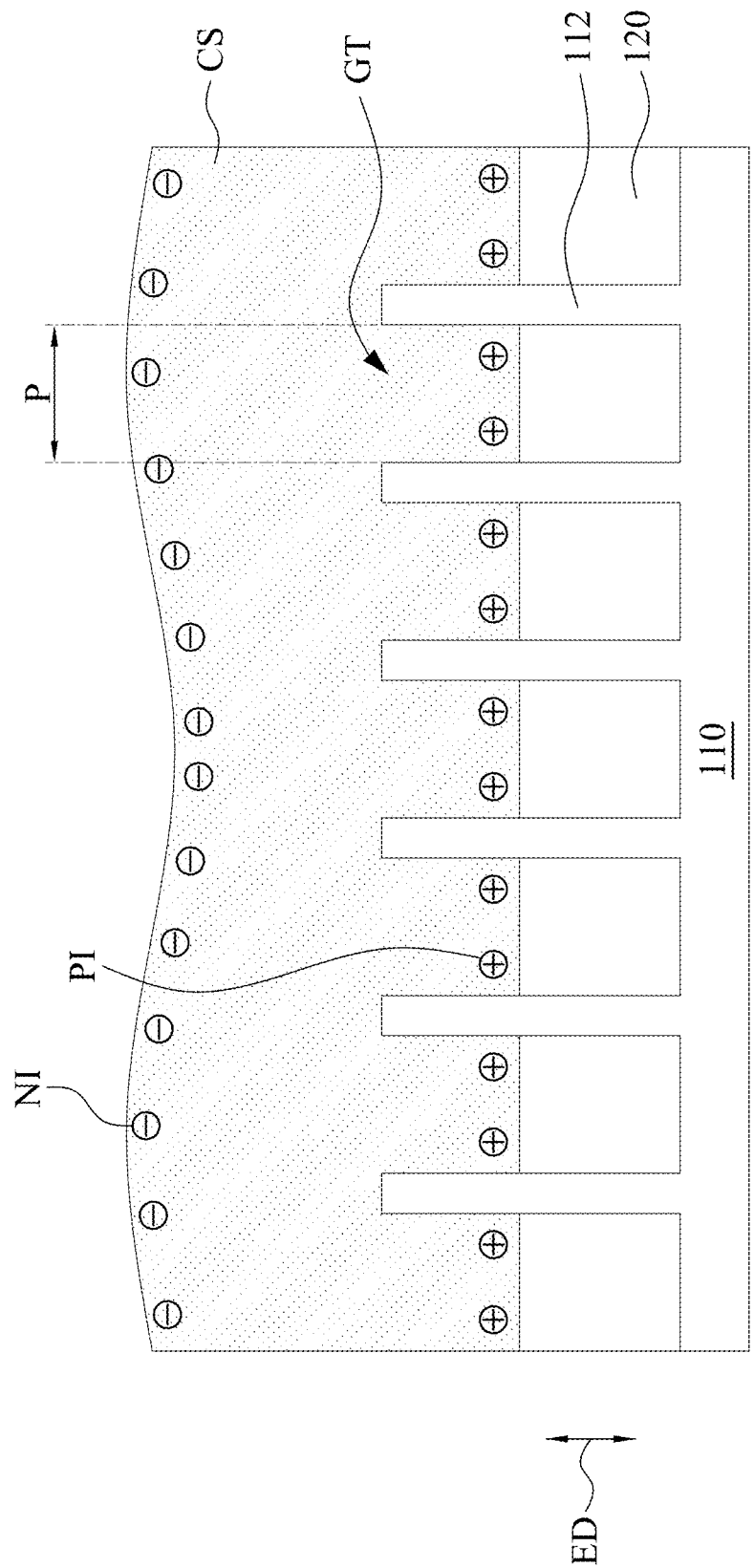

Subsequently, one or more etching processes are performed to remove the dummy gate electrodes 140 for replacing the dummy gate electrodes 140 with metal in a following step. The etching processes may include a wet etch or a combination of a wet etch and a selective dry etch. In some embodiments where removing the dummy gate electrodes 140 involves a wet etching process, the dummy gate removal includes dispensing a chemical solution containing a liquid etchant onto the wafer including the substrate 110. However, as the size of the devices shrinks, the widths (measured in a direction parallel to longitudinal axes of fins) of the dummy gate electrodes 140 reduce, thus leading to increased ratio of a height of the dummy gate electrode 140 to a width of the dummy gate electrode 140. Such an increased height/width ratio of the dummy gate electrode 140 might result in challenges of the dummy gate removal process, because the liquid etchant hardly reached bottoms of the dummy gate electrodes 140 due to the increased adhesion at deep positions of the gate trenches (e.g., gate trenches GT as shown in FIGS. 10A-10C) resulting from the dummy gate removal. As a result, the dummy gate electrodes 140 might not be completely removed, thus resulting in unwanted polysilicon residues left on the fins 112.

Figure 13:
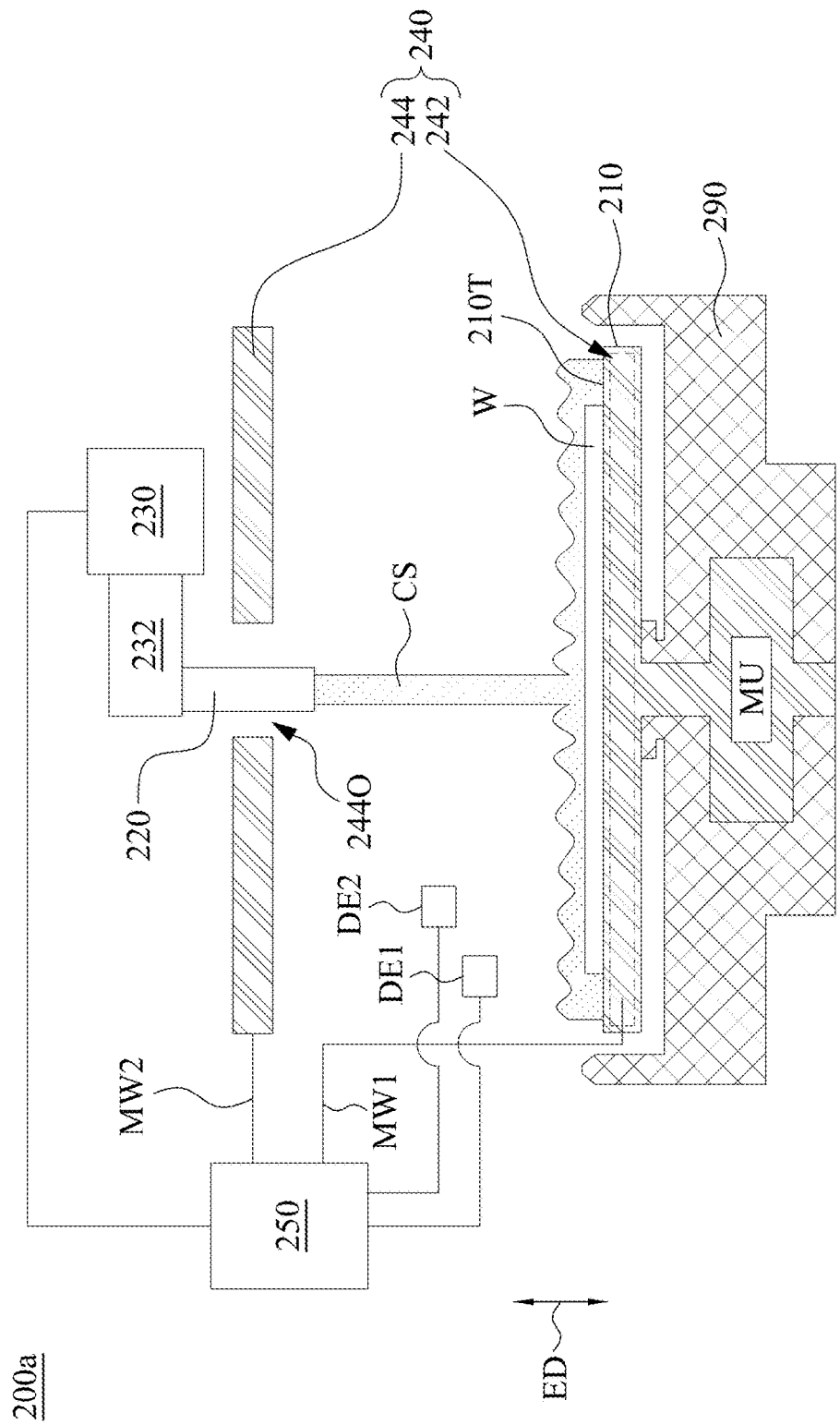
FIG. 13 is a schematic cross-sectional view of a wet etch apparatus according to some embodiments of the present disclosure.

FIGS. 9A-11C illustrate dummy gate removal using an improved wet etching process with an electric field in accordance with some embodiments. The etching process is performed to remove the dummy gate electrodes 140 (see FIGS. 8A and 8B), thereby forming gate trenches GT between the spacers 150. In the present embodiments, the dummy gate removal is performed using a wet etch apparatus 200a as illustrated in FIG. 13 that uses an electric field for enhancing the etching rate in a certain direction. For example, the electric field may enhance the etching rate in a vertical direction, such that the polysilicon residues left on the fins 112 can be reduced.

Figure 9A:
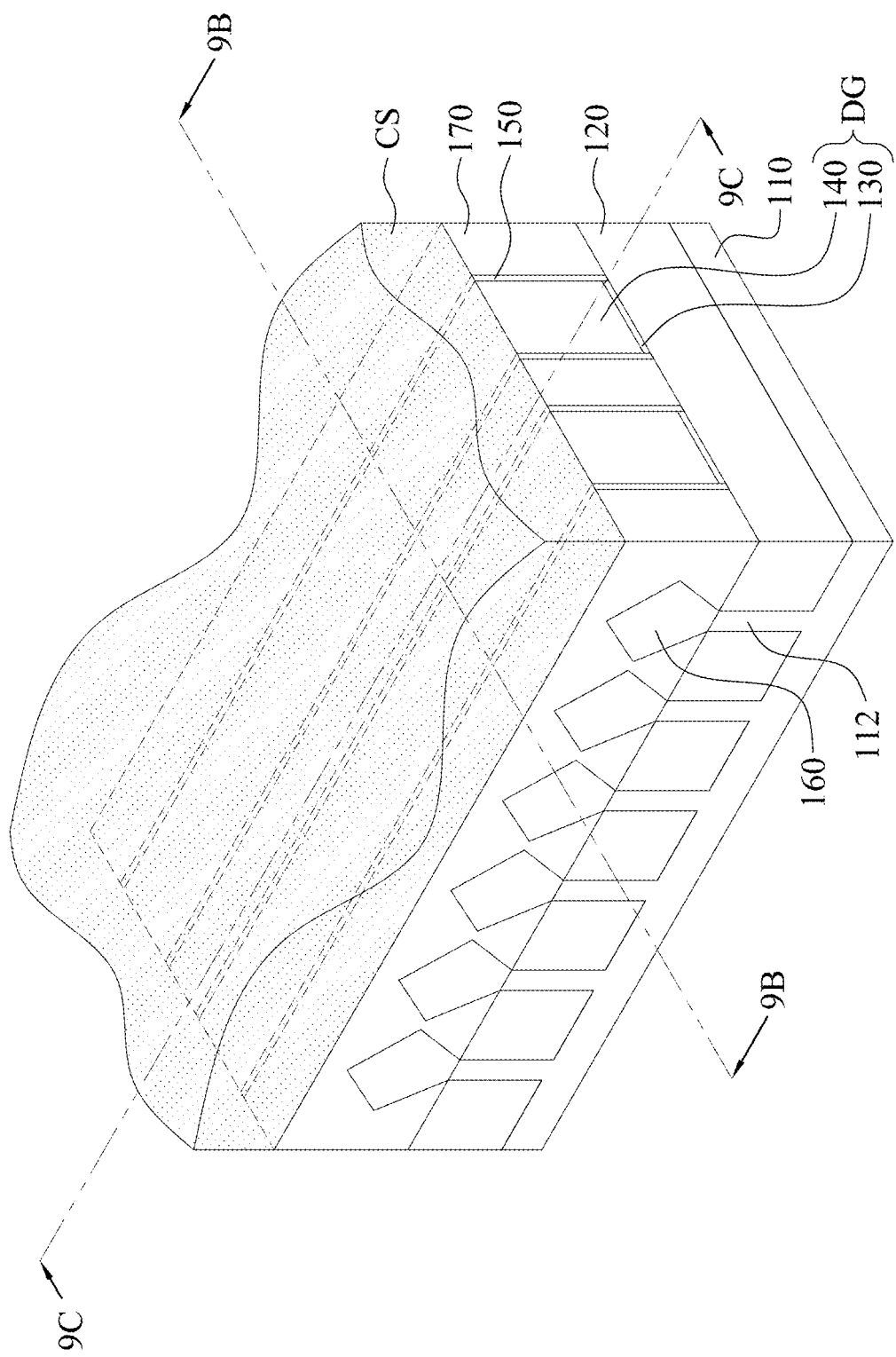
Figure 9B:
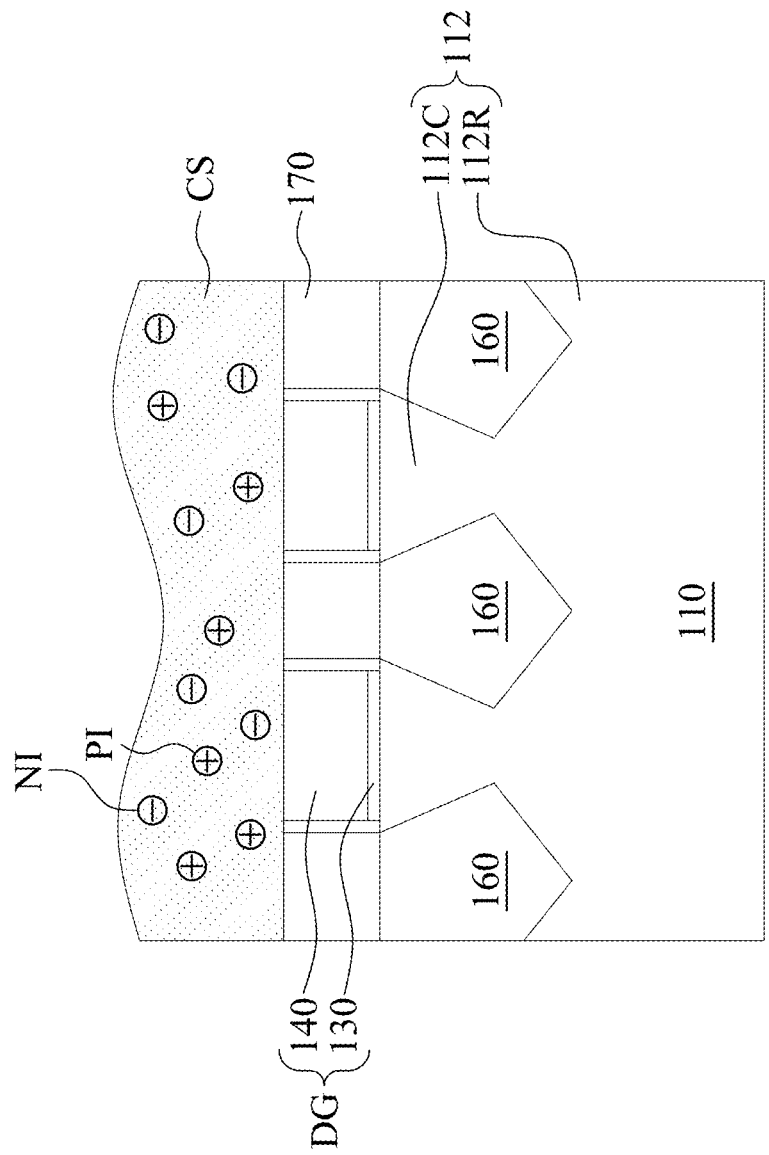
Figure 9C:
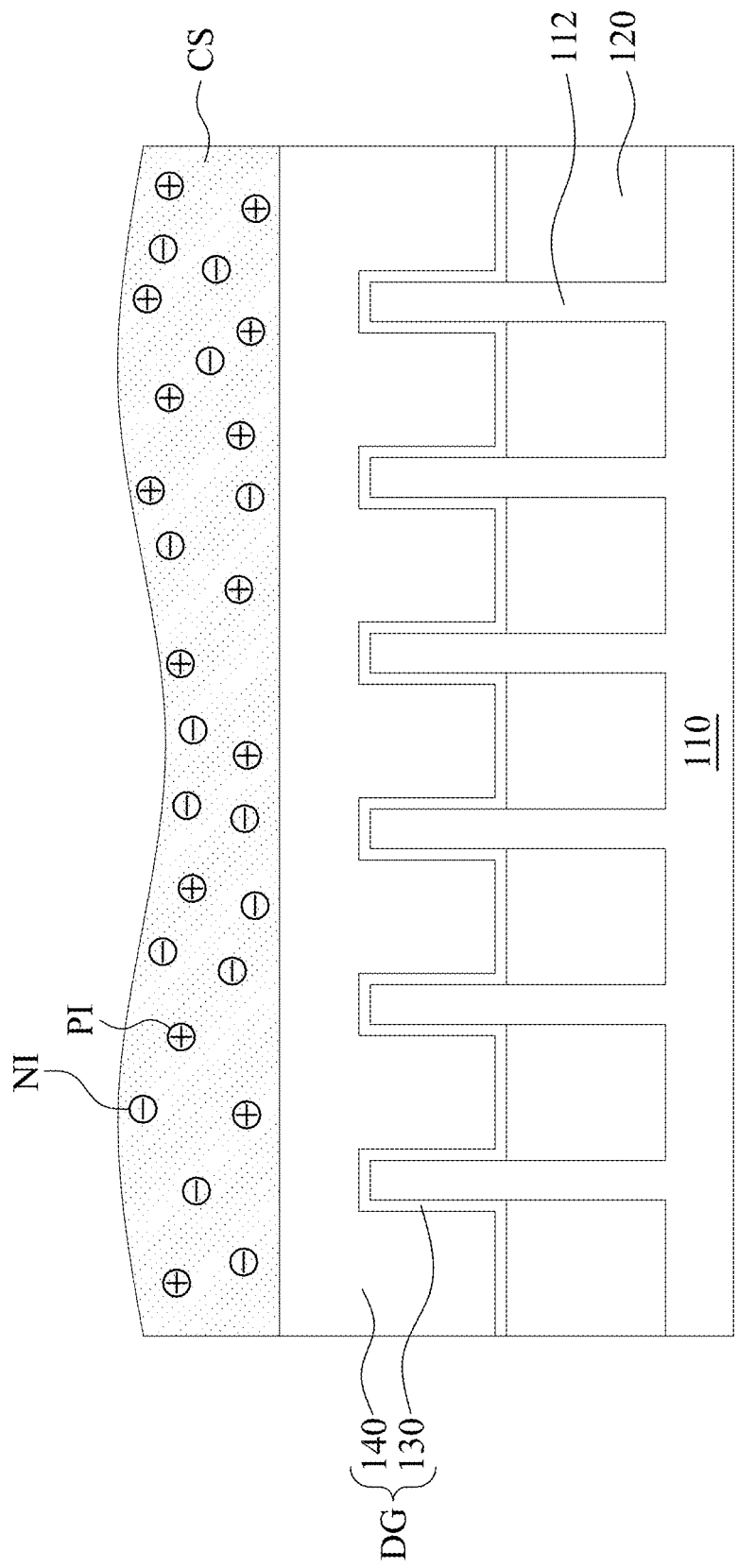

Reference is made to FIGS. 9A-9C and 13. FIG. 9B is a cross-sectional view taken along line 9B-9B in FIG. 9A. FIG. 9C is a cross-sectional view taken along line 9C-9C in FIG. 9A. The chemical solution CS is dispensed from a dispensing nozzle 220 (referring to FIG. 13) onto the substrate 110. In some embodiments, the liquid etchant in the chemical solution CS used to etch the polysilicon (e.g., the dummy gate electrodes 140) may be hydroxide containing solution (e.g., ammonium hydroxide), deionized water, and/or other suitable etchant solutions. The liquid etchant in the chemical solution CS reacts with the dummy gate electrodes 140, and produces new reactants and byproducts in the solution CS. The chemical solution CS may include a solvent (e.g., $H_2O$) to dissolve to etchants. The chemical solution CS may include positive ions PI (e.g., $H^+$) and negative ions NI (e.g., $OH^-$) which may dissociate or come from the solvent and the etchants. In some embodiments, the chemical solution CS may include polar molecules, such as $H_2O$.

Reference is made to FIGS. 10A-10C, and 13. FIG. 10B is a cross-sectional view taken along line 10B-10B in FIG. 10A. FIG. 10C is a cross-sectional view taken along line 10C-10C in FIG. 10A. As time passes by, the dummy gate electrodes 140 are removed since the chemical solution CS reacts with the dummy gate electrodes 140, thus forming gate trenches GT between corresponding gate spacers 150.

In some embodiments, an electric field is generated across the substrate 110 when the chemical solution CS reacts with the dummy gate electrodes 140, thereby inducing the positive ions PI, the negative ions NI, and/or the polar molecules in the solution CS to move vertically. As such, the solution CS diffuses downwards, which in turn will enhance vertical etching rate. Moreover, movements of the positive ions PI, the negative ions NI, and/or the polar molecules in the solution CS can also result in reduced surface tension of the solution CS. In some embodiments, the electric field may be in a range from about 300 k V/m to about 600 kV/m. In some embodiments, the contact angle or the surface tension of the solution CS may be reduced with increasing the electric field. If the electric field is less than about 300 k V/m, the resultant force applied on the positive ions PI, the negative ions NI, and/or the polar molecules in the solution CS might too weak to influence the etching process for etching through the dummy gate electrode 140. If the electric field is greater than about 600 k V/m, the contact angle and the surface tension of the solution CS may be increased with increasing the electric field, rather than reduced as in the range of from about 300 k V/m to about 600 k V/m. This reversal of variation of the contact angle and the surface tension of the solution CS may result in undesired and unpredictable etch behavior and lead to unsatisfactory resultant shape. The electric field may be uniform or nonuniform. In some other embodiments, the contact angle and the surface tension of the solution CS may be increased with increasing the electric field (e.g., in the range of from about 300 kV/m to about 600 kV/m) as illustrated in the etching process shown in FIGS. 5A and 5B.

As illustrated in FIG. 10B, the direction ED of the electric field may be substantially perpendicular to the top surface of the substrate 110 or the top surface 210T of the wafer chuck 210 (as shown in FIG. 13). For example, the electric field may be directed from top to bottom across the substrate 110, such that positive ions PI (e.g., $H^+$) in the solution CS move downward and negative ions NI (e.g., $OH^-$) move upward. In some other embodiments, the electric field may be directed from bottom to top across the substrate 110, such that positive ions PI (e.g., $H^+$) in the solution CS move upward and negative ions NI (e.g., $OH^-$) move downward. As a result of resulting movements of the positive ions PI and negative ions NI, the solution CS may diffuse to bottom portions of the dummy gate electrodes 140 and thus etch the bottom portions of the dummy gate electrodes 140. By using the electric field during the etching process, the polysilicon residues of the dummy gate electrodes 140 left on the fins 112 may be reduced.

In some embodiments, the etching process may be controlled to further remove the gate dielectrics 130, such that the gate trenches GT expose portions of the semiconductor fins 112 of the substrate 110. In some other embodiments, the etching process may be controlled not to remove the gate dielectrics 130, such that the gate dielectrics 130 remain after the etching process.

The electric field may be an alternating-current (AC) electric fields or a direct-current (DC) electric fields. In some embodiments where the AC electric field is applied, the positive ions PI and/or the negative ions NI reciprocate (i.e., move up and down). In some embodiments where the DC electric field is applied, the positive ions PI tend to move downward, and the negative ions NI tend to move upward. In some other embodiments where the DC electric field is applied, the positive ions PI tend to move upward, and the negative ions NI tend to move downward. The wafer W may remain stationary or keep spinning during applying the AC or DC electric field.

The wet etching process may be a selective wet etch. In some embodiments, the ILD 170 has higher etch resistance to the liquid etchant than that of the dummy gate electrodes 140, such that the ILD 170 remains substantially intact after the etching processes. In some embodiments, the gate spacers 150 have higher etch resistance to the liquid etchant than that of the dummy gate electrodes 140, such that the ILD 170 remains substantially intact after the etching processes.

Figure 11A:
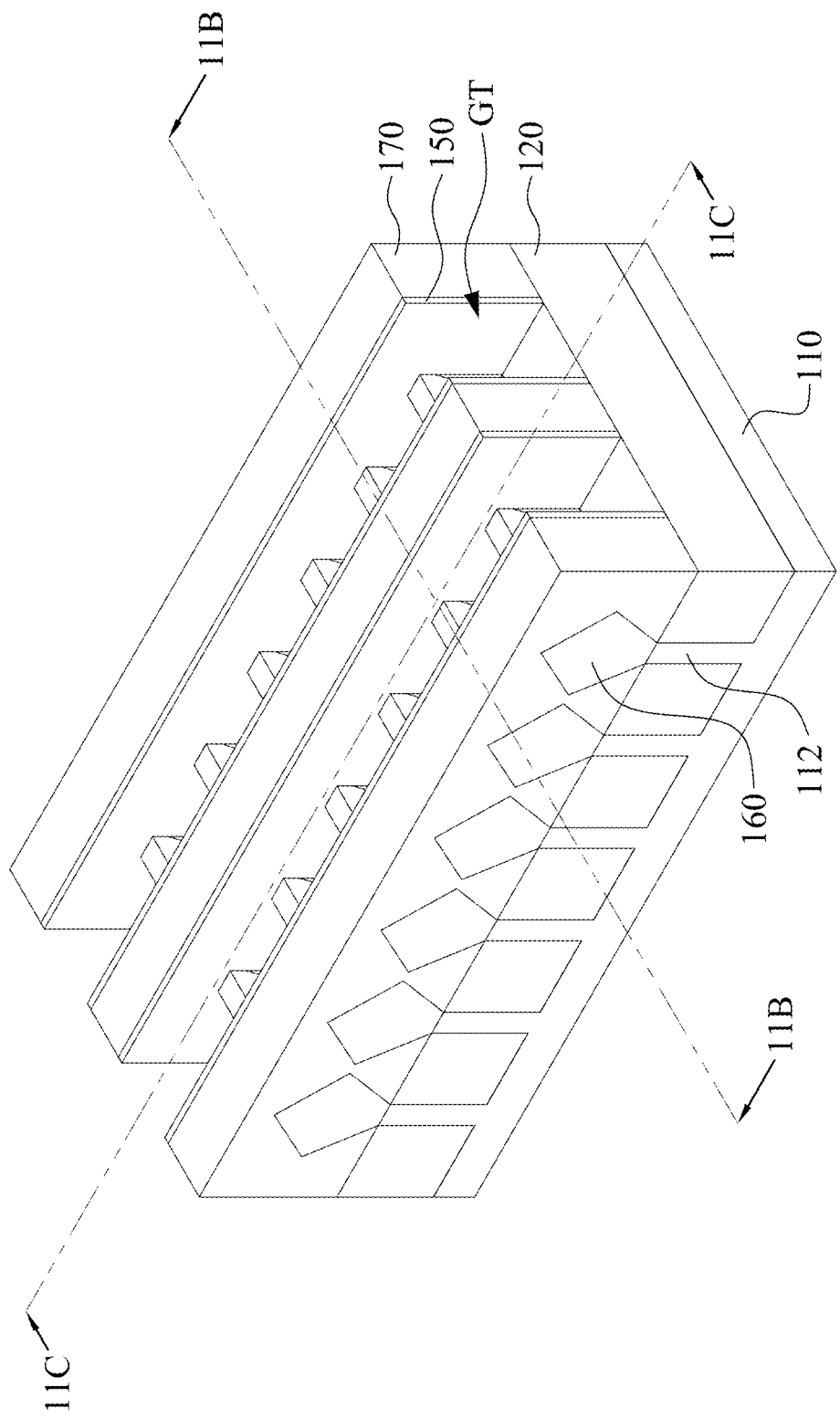
Figure 11B:
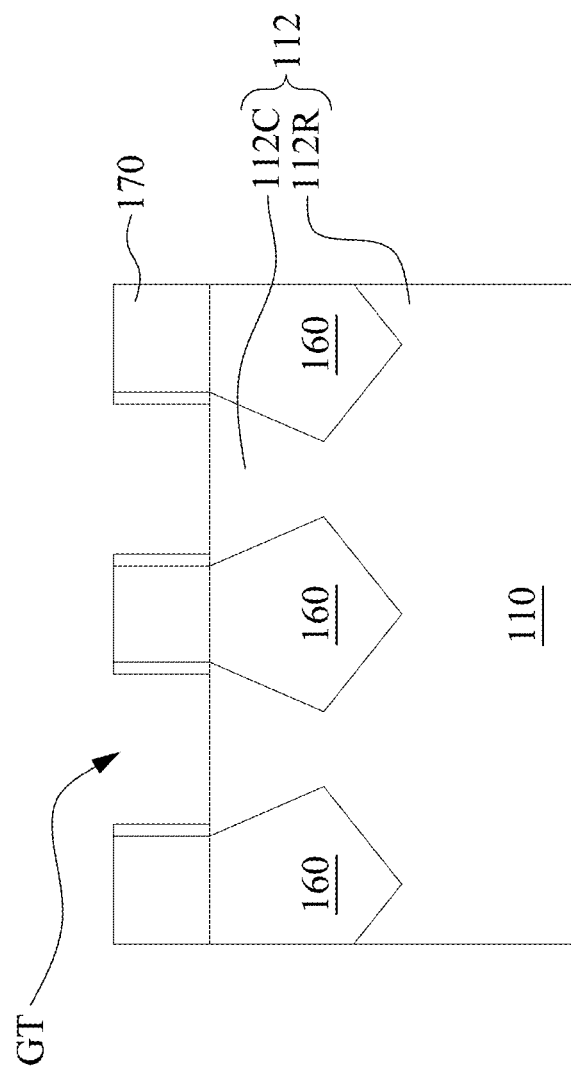
Figure 11C:
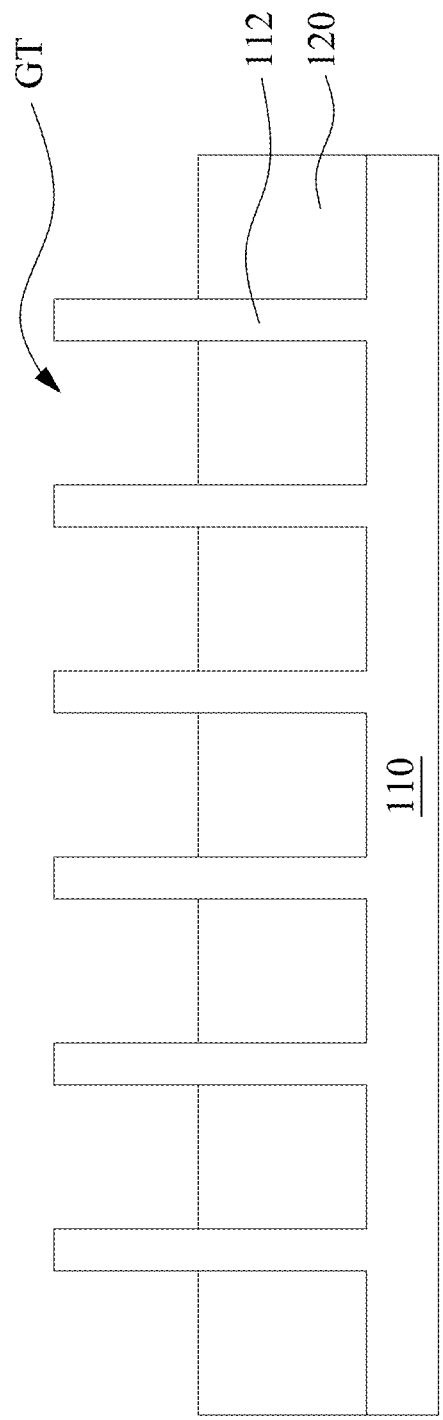

Reference is made to FIGS. 11A-11C. FIG. 11B is a cross-sectional view taken along line 11B-11B in FIG. 11A. FIG. 11C is a cross-sectional view taken along line 11C-11C in FIG. 11A. A cleaning agent (e.g., de-ionized water) may be in-situ applied in the wet etch apparatus 200a onto the wafer W as shown in FIG. 13, for removing the chemical solution CS from the wafer W, followed by a dry process performed to remove the cleaning agent from the gate trenches GT.

Figure 12A:
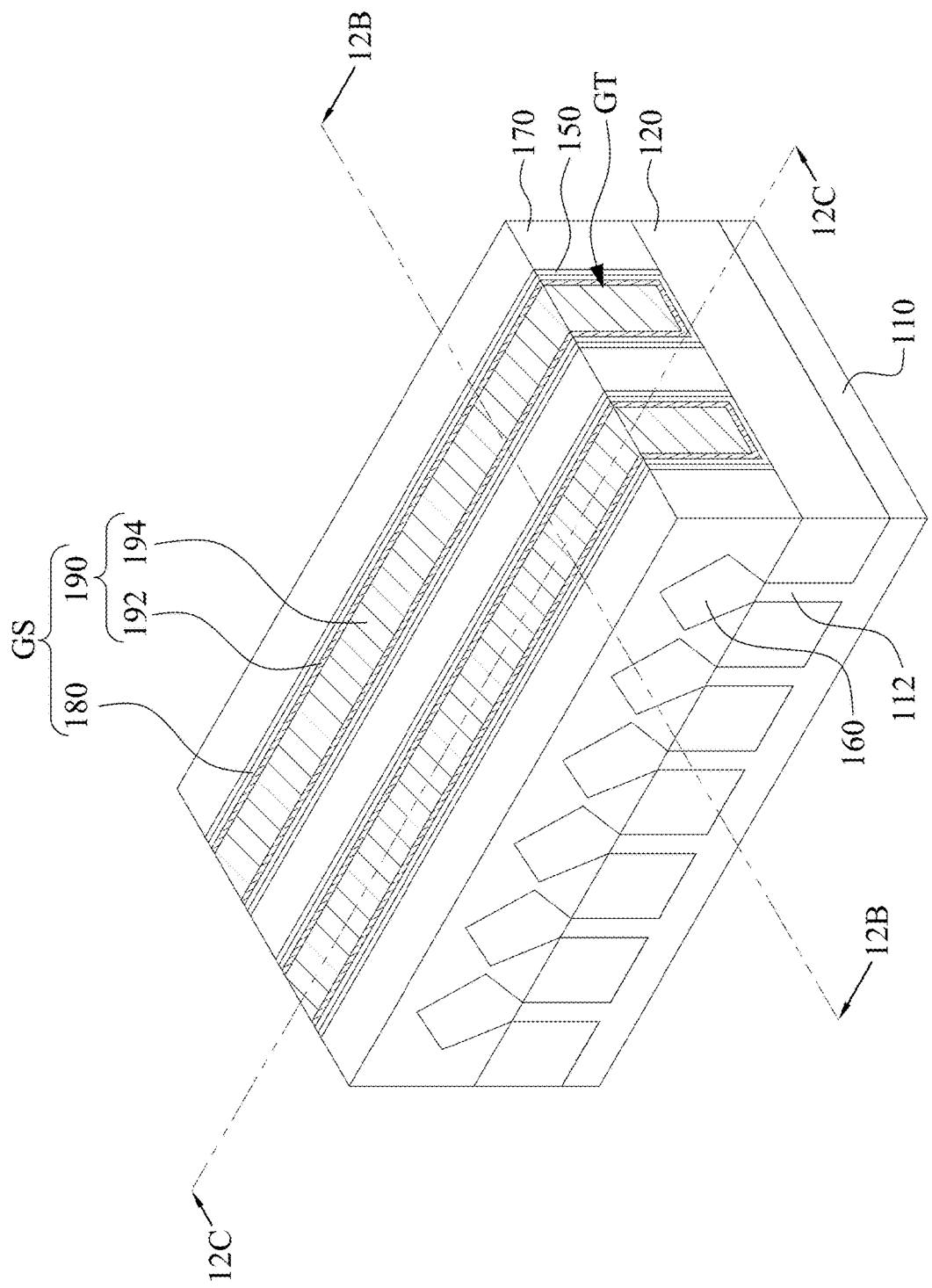
Figure 12B:
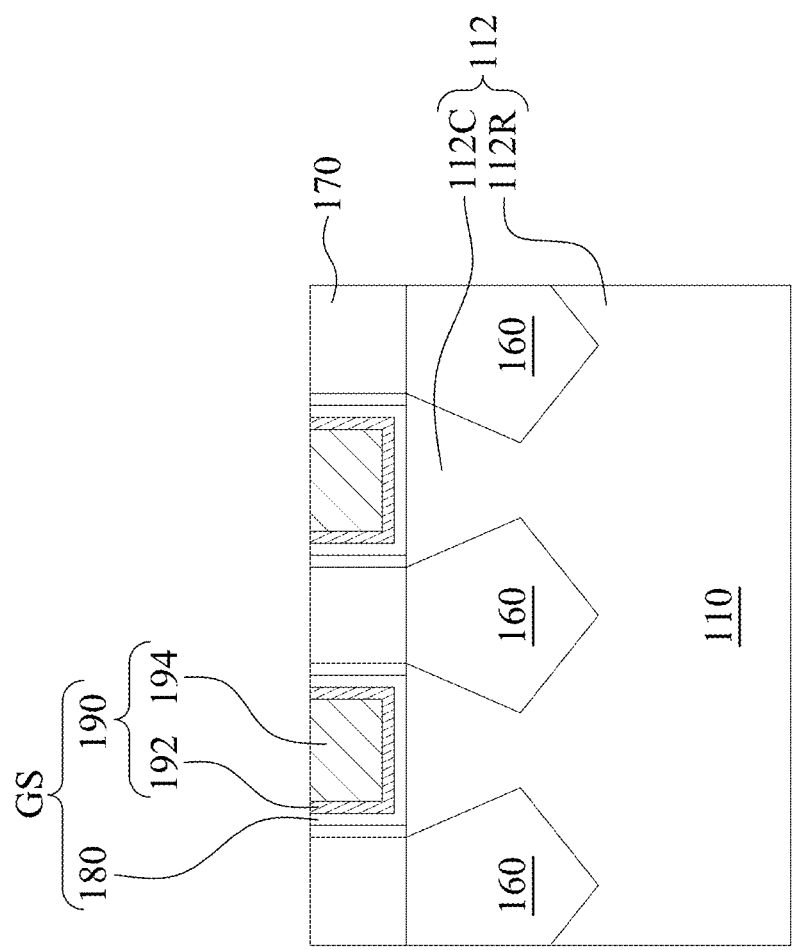
Figure 12C:
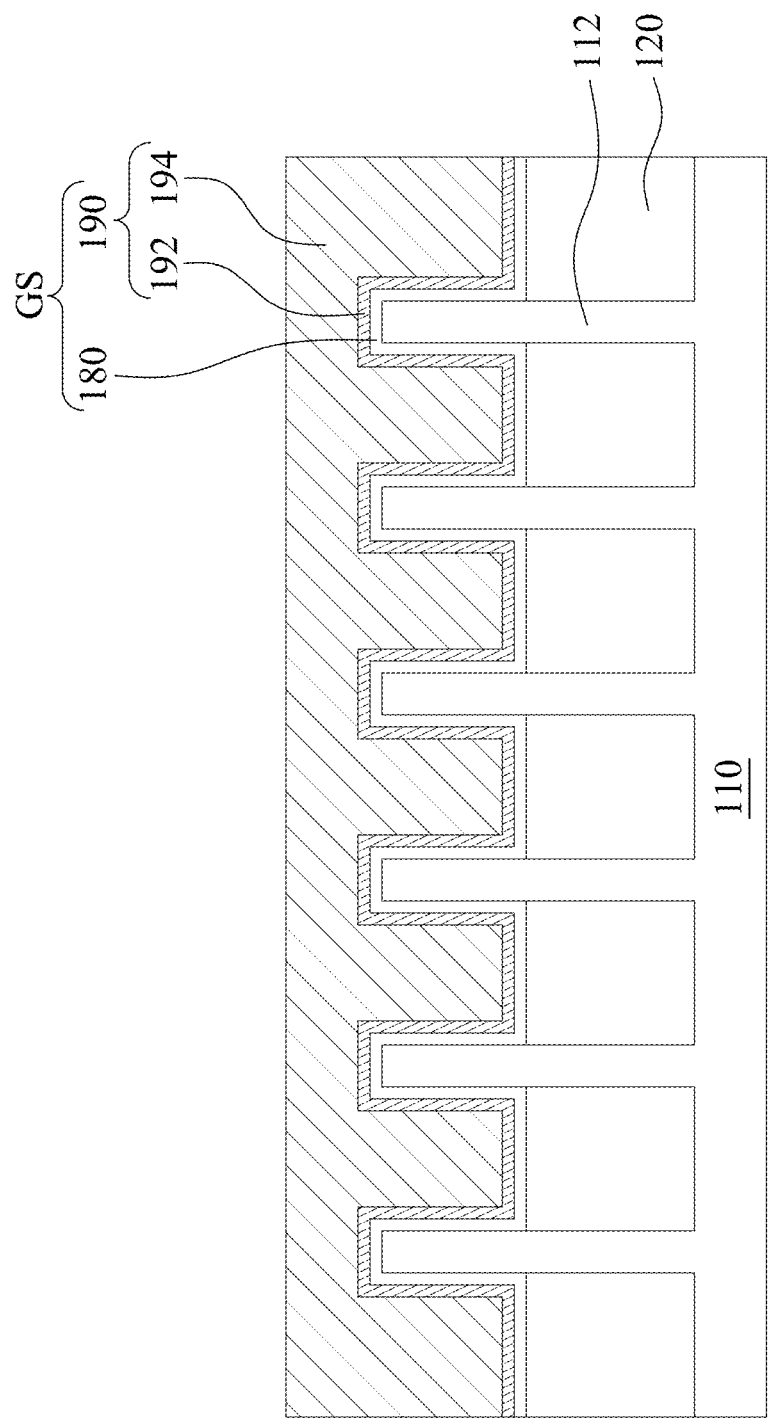

Reference is made to FIGS. 12A-12C. FIG. 12B is a cross-sectional view taken along line 12B-12B in FIG. 12A. FIG. 12C is a cross-sectional view taken along line 12C-12C in FIG. 12A. Gate stack GS are formed respectively in the gate trenches GT and cover the semiconductor fins 112 of the substrate 110. Each of the gate stack GS may include a gate dielectric 180 and a metal gate structure 190 over the gate dielectric 180.

The gate dielectrics 180 may include dielectric materials having a high-k dielectric constant, for example, greater than that of thermal silicon oxide (~3.9). For example, the high-k dielectric materials of the gate dielectrics 180 may be metal oxides, metal nitrides, metal silicates, transition metal-oxides, transition metal-nitrides, transition metal-silicates, oxynitrides of metals, metal aluminates, zirconium silicate, zirconium aluminate, or combinations thereof. The gate dielectrics 180 may be formed by ALD, PVD, CVD, oxidation, and/or other suitable methods.

The metal gate structure 190 may include a metal, metal alloy, metal carbide, metal silicide, metal carbide silicide, metal carbide nitride, and/or metal boride. In some embodiments, the metal gate structure 190 may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide. For example, the metal gate structure 190 may include one or more work function metal layers 192 and a fill metal layer 194 wrapped around by the one or more work function metal layers 192. Exemplary p-type work function metals in the one or more work function metal layers 192 include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals in the one or more work function metal layers 192 include Ti, Ag, TaAl, TaAlC, TiAlN, TaC, TaCN, TaSiN, Mn, Zr, other suitable n-type work function materials, or combinations thereof. Exemplary fill metals in the fill metal layer 194 include tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. Formation of the metal gate structures 190 includes depositing one or more work function metal layers 192 in the gate trenches GT, followed by depositing the fill metal layer 194 to overfill the gate trenches GT. Then, a CMP process is performed to remove excesses portions of the one or more work function metal layers 192 and the fill metal layer 194 outside the gate trenches GT.

FIG. 13 is a schematic cross-sectional view of a wet etch apparatus 200a according to some embodiments of the present disclosure. The wet etch apparatus 200a includes a wafer chuck 210, a dispensing nozzle 220, a liquid etchant container 230, an electric field generator 240, and a controller 250.

The liquid etchant container 230 contains a chemical solution CS including a liquid etchant and a solvent. Moreover, the chemical solution CS can be pumped from the liquid etchant container 230 to the dispensing nozzle 220 through a manifold 232 in fluid communication with the liquid etchant container 230 and the dispensing nozzle 220. The dispensing nozzle 220 dispenses the chemical solution CS onto the wafer W. The introduction of the chemical solution CS through one dispensing nozzle 220 is intended to be illustrative only and is not intended to be limited to the embodiments. Any number of separate and independent dispensing nozzle 220 or other openings to introduce the chemical solution CS may alternatively be utilized. Although a single liquid etchant container 230 is illustrated in FIG. 13, in some embodiments, plural liquid etchant containers 230 may be used in order to provide any number and type of etchants desired for the manufacturing process.

The wafer W may be placed on the wafer chuck 210 in order to position and control the wafer W during the etching process. The wafer chuck 210 may hold the wafer W using a vacuum suction force, and may optionally include heating mechanisms (not shown) in order to heat the wafer W during the etching process. The wafer chuck 210 may be connected to a motor MU to rotate the wafer chuck 210 about its axis, so that the wafer W spins when the motor MU is turned on. The wafer chuck 210 may be surrounded by a shell 290 for collected excess chemical solution CS, in which the shell 290 may have a drain opening where the chemical solution CS may exit. In some embodiments, the surface layer of the wafer chuck 210 is made of material that is chemically inert to the etchant in the chemical solution CS. As such, a surface layer of the wafer chuck 210 can withstand the chemistries involved in the etching process. In some embodiments, the surface layer of the wafer chuck 210 may include steel, stainless steel, nickel, aluminum, alloys of these, combinations of these, and like. Furthermore, although a single wafer chuck 210 is illustrated in FIG. 13, in some other embodiments, multiple wafer chucks 210 may be involved in the wet etch apparatus in order to etch multiple wafers W during a single wet etching process.

The electric field generator 240 includes a first electrode 242 and a second electrode 244 spaced apart from the first electrode 242 in a vertical direction that is perpendicular to a top surface 210T of the wafer chuck 210. The first and second electrodes 242 and 244 may be applied with different voltages, and the voltage difference can thus result in an electric field across the wafer W. For example, the voltage applied on the first electrode 242 may be higher than that on the second electrode 244, and vice versa. Negative ions NI, positive ions PI and polar molecules in the chemical solution CS move in response to the electric field, thereby enhancing the diffusion of the chemical solution CS in certain direction, which in turn will enhance etching (e.g., increasing the etching rate) in the direction. In the present embodiments, the first and second electrodes 242 and 244 are arranged in a vertical direction to generate an electric field that is substantially perpendicular to the top surface 210T of the wafer chuck 210, thereby enhancing vertical etching.

In the present embodiments, the first electrode 242 may be integral with (e.g., embedded in) the wafer chuck 210. In some other embodiments, the first electrode 242 is not integral with the wafer chuck 210. For example, in some other embodiments, the wafer chuck 210 may be arranged between the first electrode 242 and the second electrode 244. In some other embodiments, the first electrode 242 is disposed over the wafer chuck 210, and the wafer W is placed over the first electrode 242. In such embodiments, a backside of the wafer W may be in contact with the first electrode 424 during the wet etching process.

In some embodiments, the second electrode 244 is above the wafer chuck 210, and has an opening 2440 dimensioned to allow the dispensing nozzle 220 to dispense the chemical solution CS through the second electrode 244. In the depicted embodiments, the dispensing nozzle 220 extends through the opening 2440 of the second electrode 244, so as to prevent the chemical solution CS from splashing on the second electrode 244. In some other embodiments, the dispensing nozzle 220 is above the opening 2440 of the second electrode 244, so that the chemical solution CS is dispensed through the opening 2440 of the second electrode 244. The controller 250 is electrically connected to the first and second electrode 242 and 244 through respective metal wires MW1 and MW2 for applying different voltages onto the respective first and second electrodes 242 and 244. The controller 250 may also be electrically connected to a pump in the liquid etchant container 230, so as to pump the chemical solution CS to the dispensing nozzle 220.

In some embodiments, the wet etch apparatus 200a includes a chemical solution concentration detector DE1 for detecting a concentration of the chemical solution CS and a light detector DE2 (e.g., a CCD detector) for detecting reflection intensity distribution of reflection light beams from the entire wafer during and/or after the wet etching process. The detected reflection intensity distribution is used to estimate topography of the entire wafer during and/or after the wet etching process, which in turn can be used to inspect an etching result of the wet etching process. The controller 250 may receive the detected concentration data and the detected reflection intensity distribution data from the detectors (e.g., the detectors DE1 and DE2), analyze the detected concentration data and the detected reflection intensity distribution data, and send signals to the electric field generator 240 for changing the direction and/or the amplitude of the electric field used on the next wafer based on the analysis result, if the analysis result is unsatisfactory. On the other hand, if the analysis result is satisfactory, the direction and/or the amplitude of the electric field used on the next wafer may remain the same as that used on the current wafer. Example of changing the direction and/or the amplitude of the electric field includes changing the voltages applied to the first and second electrodes 242 and 244.

In some embodiments, after performing the wet etching process on a first wafer (referred to wafer W1), the etch result of the first wafer W1 can be detected and analyzed. Thereafter, the first wafer W1 is unloaded from the wet etch apparatus 200a using, for example, a robot arm (not shown). Afterwards, when a second wafer (referred to as wafer W2) is loaded into the wet etch apparatus 200a, the electric field generator 240 generates a different electric field than that used in etching the previous wafer W1. In greater detail, the electric field used in the present wafer W2 is controlled based on the analyzed etch result of the previous wafer W1. In this way, the etch result of the wafer W2 can be improved as compared to the previous wafer W1. In some other embodiments, the electric field can be tuned in a real time manner according to the analysis result during etching the target wafer. In some other embodiments, the wet etch apparatus 200a may further include includes other types of detectors, and the controller 250 may change the direction and/or the amplitude of the electric field based on the analysis result analyzed from detected results of the other types of detectors.

FIG. 14A is a schematic cross-sectional view of another wet etch apparatus 200b according to some embodiments of the present disclosure. FIG. 14B is a schematic top view of the wet etch apparatus 200b of FIG. 14A. The wet etch apparatus 200b is similar to the wet etch apparatus 200a as shown FIG. 13, and at least one difference between the wet etch apparatus 200b and the wet etch apparatus 200a as shown in FIG. 13 is that the first and second electrode 242 and 244 of the wet etch apparatus 200b are movable.

In the present embodiments, the electric field generator 240 may include vehicles 241 and 243 movably coupled to a guide rail 246, and the first and second electrode 242 and 244 are respectively disposed on the vehicles 241 and 243. The vehicles 241 and 243 are electrically connected with the controller 250 and thus controlled by the controller 250. By motion of the vehicles 241 and 243, the first and second electrodes 242 and 244 can be moved to desired positions for generating an electric field in a desired direction. In some embodiments, before an electric field is generated, the first and second electrode 242 and 244 can be moved to suitable positions according to the desired etch direction, followed by applying the first and second electrodes 242 and 244 with different voltages for generating the electric field in the desired etch direction.

In the present embodiments, the guide rail 246 may encircle the wafer chuck 210 in a plane perpendicular to the top surface 210T of the wafer chuck 210. To be specific, the guide rail 246 extends from a position below the wafer chuck 210 to a position above the wafer chuck 210, such that the first and second electrodes 242 and 244 can be moved between the position below the wafer chuck 210 and the position above the wafer chuck 210. Therefore, the first and second electrodes 242 and 244 can generate the electric field in any suitable direction. For example, the direction of the electric field may be inclined with respect to the top surface 210T of the wafer chuck 210, perpendicular to the top surface 210T, or parallel with the top surface 210T. In some other embodiments, the guide rail 246 may encircle the wafer chuck 210 in a plane parallel with the top surface 210T of the wafer chuck 210.

In some embodiments, the first and second electrodes 242 and 244 may be arc-shaped and have a curvature substantially the same as the wafer W, as illustrated in the top view as shown in FIG. 14B. In some other embodiments, the first and second electrode 242 and 244 may be two parallel electrode plates. Other details of the wet etch apparatus 200b as shown in FIGS. 14A and 14B are similar to those of the wet etch apparatus 200a of FIG. 13, and therefore not repeated herein for the sake of brevity.

Figure 15:
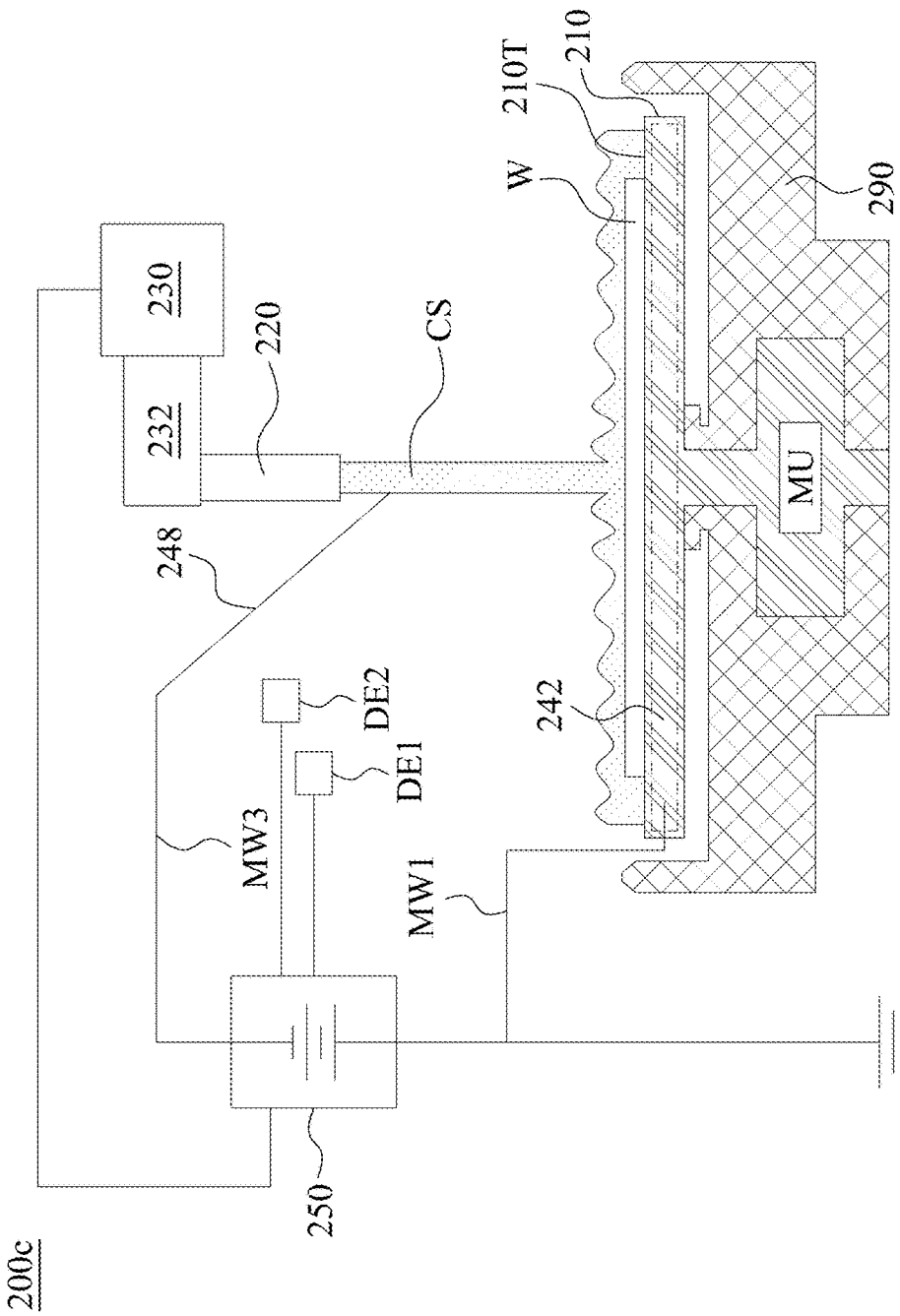
FIG. 15 is a schematic cross-sectional view of a wet etch apparatus according to some embodiments of the present disclosure.

FIG. 15 is a schematic cross-sectional view of another wet etch apparatus 200c according to some embodiments of the present disclosure. The wet etch apparatus 200c is similar to the wet etch apparatus 200a as shown in FIG. 13, and at least one difference between the wet etch apparatus 200c and the wet etch apparatus 200a as shown in FIG. 13 is that the electric field generator further includes a probe 248 for applying a voltage onto the chemical solution CS. A surface layer of the probe 248 is made of a material that is chemically inert to the etchant in the chemical solution CS. As such, the surface layer of the probe 248 can withstand the chemistries involved in the etching process. In some embodiments, the surface layer of the probe 248 may be steel, stainless steel, nickel, aluminum, alloys of these, combinations of these, and like. The second electrode 244 (referring to FIGS. 13-14B) may be omitted in the present embodiments.

The controller 250 may be electrically connected to the probe 248 and the first electrode 242 respectively through metal wires MW3 and MW1. In this way, the controller 250 can apply different voltages to the probe 248 and the first electrode 242, respectively. Other details of the wet etch apparatus 200c are similar to those of the wet etch apparatus 200a as shown in FIG. 13, and therefore not repeated herein for the sake of brevity. For example, the wafer chuck 210 can be rotated using the motor MU during applying the voltages to the probe 248 and the first electrode 242. In this way, the wafer W is spun during applying the voltages to the probe 248 and the first electrode 242.

Figure 16:
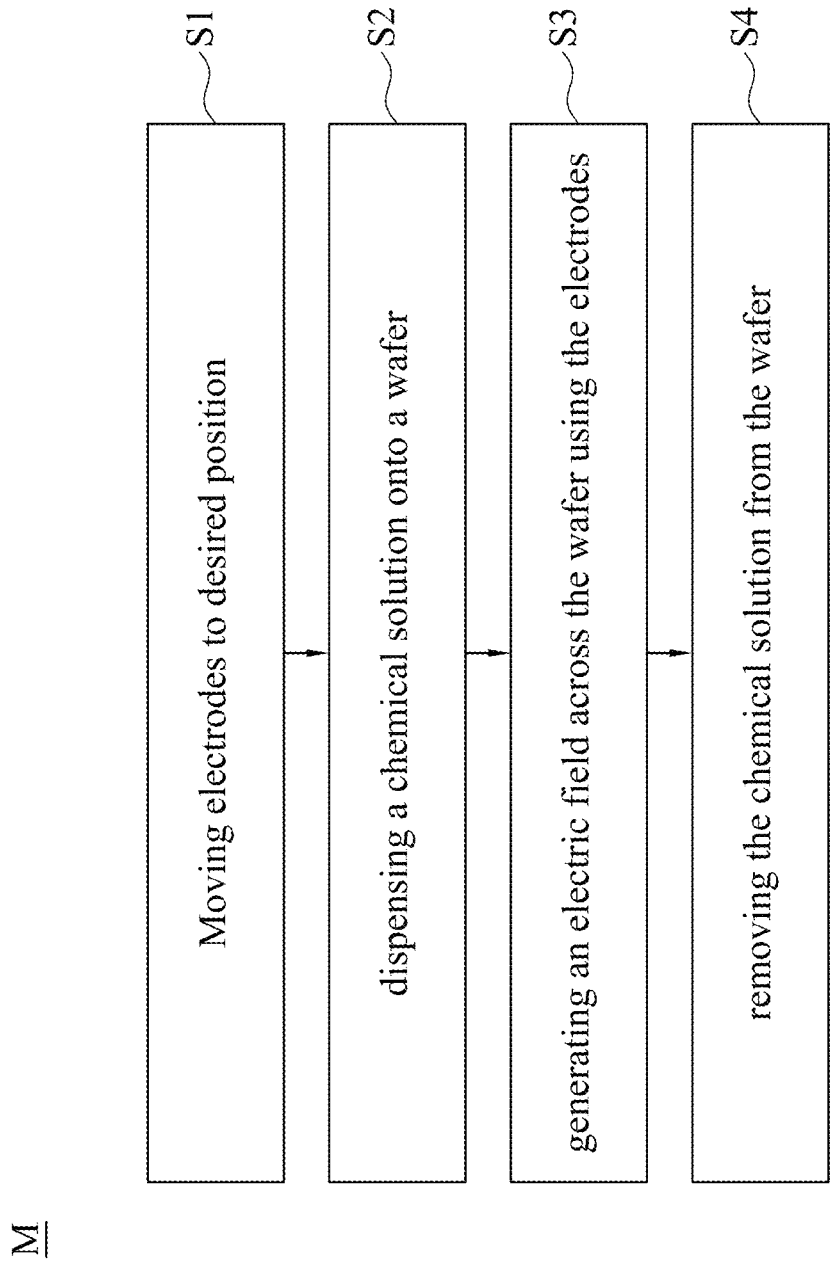
FIG. 16 is a flow chart of a wet etching method according to some embodiments of the present embodiments.

FIG. 16 is a flow chart of a wet etching method M according to some embodiments of the present embodiments. The method M includes steps S1-S4. The illustration is merely exemplary and is not intended to limit beyond what is specifically recited in the claims that follow. It is understood that additional operations may be provided before, during, and after the steps shown by FIG. 16, and some of the steps described below can be replaced or eliminated for additional embodiments of the method. The order of the operations/processes may be interchangeable.

Reference is made to FIG. 16. At step S1, the electrodes or probes are moved to desired positions. For example, the controller 250 may control the movement of the electrodes or probes. The desired positions may be predetermined in advance based on a desired etch direction. For example, in some embodiments of recessing semiconductor fins, the first and second electrodes 242 and 244 (referring to FIGS. 14A and 14B) may be moved to target positions that are spaced apart horizontally, which in turn will result in improved lateral etching rate. In some embodiments of the dummy gate removal process, the first and second electrodes 242 and 244 may be move to target positions that are spaced apart vertically, which in turn will result in improved vertical etching rate. In some embodiments where the electrodes are already in desired positions, the step S1 can be omitted.

At step S2, the controller 250 may control a pump in the liquid etchant container 230 to pump the chemical solution CS to the dispensing nozzle 220, so that the dispensing nozzle 220 dispenses the chemical solution CS onto the wafer W.

At step S3, an electric field is generated across the wafer W for enhancing the diffusion of the chemical solution CS in one or more desired etching directions, such that the target structures (e.g., fins in the fin recessing process or polysilicon gate electrodes in the dummy gate removal process) are etched by the liquid etchant in the chemical solution CS in one or more the desired etching directions. For example, the controller 250 may apply voltage difference between the first and second electrodes 242 and 244 (referring to FIGS. 13, 14A, and 14B) or between the probe 248 and the first electrode 242 (referring to FIG. 15). In the present embodiments, the electrodes or the probe may remain stationary during the etching process, so that the direction of the electric field is kept in the same direction during the etching process. In some other embodiments, the electrodes or the probe may be moved during the etching process, such that the direction of the electric field changes during the etching process. In the depicted flow chart as shown in FIG. 16, the electric field is generated after dispensing the chemical solution CS onto the wafer W (i.e., the step S2). In some other embodiments, the electric field is generated before dispensing the chemical solution CS onto the wafer W (i.e., the step S2). In some embodiments, the electric field is generated during dispensing the chemical solution.

At step S4, the chemical solution CS is removed from the wafer W, for example, by a cleaning process. In the cleaning process, a cleaning agent may be applied on to the wafer W for removing the chemical solution CS from the wafer W. In some embodiments, the electric field generator 240 may generate the electric field during the cleaning process. The electric field may induce the cleaning agent (e.g., de-ionized water) to diffuse in one or more desired directions and reducing or increasing the surface tension of the cleaning agent, thereby control the directionality of cleaning. In these embodiments, the electric field generator 240 may keep generating the electric field from the etching process to the cleaning process. In some other embodiments, the cleaning process may be performed without the electric field. Stated differently, the electric field can be turned off before applying the cleaning agent. After the applying the cleaning agent, a dry process may be performed.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that an electric field is applied during a wet etching process for enhancing the diffusion of the chemical solution in one or more desired directions, thereby improving directionality control of the wet etching and hence preventing under-etching or over-etching. Another advantage is that polysilicon residues resulting from the dummy gate removal process can be reduced by using the controlled directionality of a wet etching process performed to remove the polysilicon gate electrodes. Still another advantage is that source/drain proximity can be improved by using the controlled directionality of a wet etching process performed to recess fins.

According to some embodiments of the present disclosure, a wet etch apparatus includes a wafer chuck, a dispensing nozzle above the wafer chuck, a rail, first and second vehicles, and an electric field generator. The rail extends at least from a first position aligned laterally with the wafer chuck to a second position higher than a top surface of the wafer chuck. The first and second vehicles are movable along the rail. The electric field generator is operative to generate an electric field across the wafer chuck. The electric field generator comprises a first electrode carried by the first vehicle and a second electrode carried by the second vehicle.

According to some embodiments of the present disclosure, a wet etch apparatus includes a wafer chuck, a dispensing nozzle above the wafer chuck, a rail, first and second vehicles, and an electric field generator. The rail extends at least from a first position below a top surface of the wafer chuck to a second position above the top surface of the wafer chuck. The first and second vehicles are movable along the rail. The electric field generator is operative to generate an electric field across the wafer chuck, wherein the electric field generator comprises a first electrode carried by the first vehicle and a second electrode carried by the second vehicle.

According to some embodiments of the present disclosure, a wet etch apparatus includes a wafer chuck, a dispensing nozzle above the wafer chuck, a rail, first and second vehicles, and an electric field generator. The rail encircles the wafer chuck. The first and second vehicles are movable along the rail. The electric field generator is operative to generate an electric field across the wafer chuck, wherein the electric field generator comprises a first electrode carried by the first vehicle and a second electrode carried by the second vehicle.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wet etch apparatus, comprising:
   a wafer chuck;
   a dispensing nozzle above the wafer chuck;
   a rail extending at least from a first position aligned laterally with the wafer chuck to a second position higher than a top surface of the wafer chuck;
   first and second vehicles movable along the rail; and
   an electric field generator operative to generate an electric field across the wafer chuck, wherein the electric field generator comprises a first electrode carried by the first vehicle and a second electrode carried by the second vehicle.

2. The wet etch apparatus of claim 1, wherein the second position is directly above the top surface of the wafer chuck.

3. The wet etch apparatus of claim 1, wherein the rail further extends to a third position aligned laterally with the wafer chuck and opposite to the first position.

4. The wet etch apparatus of claim 1, wherein the rail further extends across the top surface of the wafer chuck.

5. The wet etch apparatus of claim 1, wherein the rail further extends to a fourth position below the wafer chuck.

6. The wet etch apparatus of claim 1, wherein one of the first and second electrodes is an electrode plate.

7. The wet etch apparatus of claim 1, wherein one of the first and second electrodes is arc-shaped.

8. The wet etch apparatus of claim 1, wherein the electric field generated by the electric field generator is a direct-current (DC) electric field.

9. The wet etch apparatus of claim 1, wherein the electric field generated by the electric field generator is an alternating-current (AC) electric field.

10. A wet etch apparatus, comprising:
a wafer chuck;
a dispensing nozzle above the wafer chuck;
a rail extending at least from a first position below a top surface of the wafer chuck to a second position above the top surface of the wafer chuck;
first and second vehicles movable along the rail; and
an electric field generator operative to generate an electric field across the wafer chuck, wherein the electric field generator comprises a first electrode carried by the first vehicle and a second electrode carried by the second vehicle.

11. The wet etch apparatus of claim 10, wherein the rail encircles the wafer chuck in a plane perpendicular to the top surface of the wafer chuck.

12. The wet etch apparatus of claim 10, wherein the first and second electrodes are electrode plates.

13. The wet etch apparatus of claim 10, wherein the first and second electrodes are arc-shaped.

14. The wet etch apparatus of claim 10, wherein the electric field generated by the electric field generator is a direct-current (DC) electric field.

15. The wet etch apparatus of claim 10, wherein the electric field generated by the electric field generator is an alternating-current (AC) electric field.

16. A wet etch apparatus, comprising:
a wafer chuck;
a dispensing nozzle above the wafer chuck;
a rail encircling the wafer chuck;
first and second vehicles movable along the rail; and
an electric field generator operative to generate an electric field across the wafer chuck, wherein the electric field generator comprises a first electrode carried by the first vehicle and a second electrode carried by the second vehicle.

17. The wet etch apparatus of claim 16, wherein the first and second electrodes are electrode plates.

18. The wet etch apparatus of claim 16, wherein the first electrode has a concave surface facing the wafer chuck, and the second electrode has a concave surface facing the wafer chuck.

19. The wet etch apparatus of claim 16, wherein the rail is in a plane perpendicular to a top surface of the wafer chuck.

20. The wet etch apparatus of claim 16, wherein the rail is in a plane parallel with a top surface of the wafer chuck.

* * * * *